(12) United States Patent
Yoshida et al.

(10) Patent No.: US 7,336,123 B2
(45) Date of Patent: Feb. 26, 2008

(54) CHOPPER AMPLIFIER CIRCUIT APPARATUS OPERABLE AT LOW VOLTAGE UTILIZING SWITCHED OPERATIONAL AMPLIFIER

(75) Inventors: Takeshi Yoshida, Hiroshima (JP);
Atsushi Iwata, Hiroshima (JP);
Mamoru Sasaki, Hiroshima (JP);
Takayuki Mashimo, Tokyo (JP);
Yoshihiro Masui, Hiroshima (JP);
Junji Nakatsuka, Osaka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 11/390,116

(22) Filed: Mar. 28, 2006

(65) Prior Publication Data

US 2006/0244521 A1 Nov. 2, 2006

(30) Foreign Application Priority Data

Mar. 29, 2005 (JP) .......................... P2005-093683

(51) Int. Cl.
*H03F 1/02* (2006.01)
(52) U.S. Cl. .......................................... 330/9; 327/124
(58) Field of Classification Search .................... 330/9; 327/124, 307
See application file for complete search history.

(56) References Cited

U.S. PATENT DOCUMENTS

| 3,597,696 | A | * | 8/1971 | Rabindran | .................... | 330/10 |
| 5,172,115 | A | | 12/1992 | Kerth et al. | | |
| 5,206,602 | A | | 4/1993 | Baumgartner et al. | | |
| 5,477,481 | A | | 12/1995 | Kerth | | |
| 5,579,247 | A | | 11/1996 | Kerth et al. | | |
| 6,002,299 | A | | 12/1999 | Thomsen | | |
| 6,326,620 | B1 | | 12/2001 | Willis | | |
| 6,504,404 | B2 | | 1/2003 | Uchiki et al. | | |
| 6,621,334 | B2 | * | 9/2003 | Ausserlechner et al. | ....... | 330/9 |

(Continued)

FOREIGN PATENT DOCUMENTS

JP 47-17841 5/1972

(Continued)

OTHER PUBLICATIONS

K. D. Wise, "Wireless Implantable MicroSystems: Coming Breakthroughs in Health Care", Symposium on VLSI Circuits Digest of Technical Papers, pp. 106-109, Jun. 2002.

(Continued)

*Primary Examiner*—Henry Choe
(74) *Attorney, Agent, or Firm*—Wenderoth, Lind & Ponack, L.L.P.

(57) ABSTRACT

In a chopper amplifier circuit operable at a low voltage utilizing a switched operational amplifier, a chopper modulator chopper-modulates an input signal according to a predetermined control signal, and outputs a chopper-modulated signal. An amplifier circuit constituted by the switched operational amplifier amplifies the chopper-modulated signal outputted from the chopper modulator, and outputs an amplified chopper-modulated signal. A chopper-demodulator of the switched operational amplifier chopper-demodulates the amplified chopper-modulated signal outputted from the amplifier circuit according to the control signal, and outputs a demodulated output signal as a chopper-amplified output signal from an output terminal. A chopper modulator chopper-modulates a demodulated signal outputted from the chopper demodulator according to the control signal, and outputs a chopper-modulated signal to an input terminal of the amplifier circuit.

23 Claims, 19 Drawing Sheets

U.S. PATENT DOCUMENTS

| | | | |
|---|---|---|---|
| 6,734,723 B2 * | 5/2004 | Huijsing et al. | 330/9 |
| 6,876,255 B2 | 4/2005 | Reber | |
| 7,233,198 B2 * | 6/2007 | Niederkorn | 330/9 |

FOREIGN PATENT DOCUMENTS

| | | |
|---|---|---|
| JP | 60-128702 | 7/1985 |
| JP | 5-175787 | 7/1993 |
| JP | 6-224659 | 8/1994 |
| JP | 2001-4444 | 1/2001 |
| JP | 2002-504280 | 2/2002 |
| JP | 2002-314398 | 10/2002 |
| JP | 2004-521567 | 7/2004 |
| WO | 2004/043062 | 5/2002 |

OTHER PUBLICATIONS

T. Yoshida et al., "A Design of Neural Signal Sensing LSI with Multi-Input-Channels", IEICE Transactions Fundamentals, vol. E87-A, No. 2, pp. 376-383, Feb. 2004.

C. C. Enz et al., "Circuit Techniques for Reducing the Effects of Op-Amp Imperfections: Autozeroing, Correlated Double Sampling, and Chopper Stabilization", Proceedings of the IEEE, vol. 84, No. 11, pp. 1584-1614, Nov. 1996.

A. T. K. Tang, "A 3μV-Offset Operational Amplifier with 20nv/$\sqrt{Hz}$ Input Noise PSD at DC Employing both Chopping and Autozeroing", ISSCC Digest of Technical Papers, pp. 386-387, Feb. 2002.

A. M. Abo et al., "A 1.5-V, 10-bit 14.3-MS/s CMOS Pipeline Analog-to-Digital Converter", Journal of Solid State Circuits, vol. 34, No. 5, pp. 599-606, May 1999.

V. Cheung et al., "A 1V CMOS Switched-Opamp Switched-Capacitor Pseudo-2-Path Filter", ISSCC Digest of Technical Papers, pp. 154-155, Feb. 2000.

Q. Huang, C. Menolfi, "A 200nV offset 6.5nV/$\sqrt{Hz}$ Noise PSD 5.6 kHz Chopper Instrumentation Amplifier in 1 μm Digital CMOS", ISSCC Digest of Technical Papers, pp. 362-363, Feb. 2001.

J. F. Duque-Carrillo et al., "1-V Rail-to-Rail Operational Amplifiers in Standard CMOS Technology", Journal of Solid State Circuits, vol. 35, No. 1, pp. 33-34, Jan. 2000.

* cited by examiner

REPLICA CIRCUIT 40

Fig. 14

COMPARISON OF OPERATIONAL AMPLIFIER OF PRESENT IMPLEMENTAL EXAMPLE WITH OPERATIONAL AMPLIFIER OF EACH NON-PATENT DOCUMENT

| ITEM | PRESENT IMPLEMENTAL EXAMPLE | NON-PATENT DOCUMENT 4 | NON-PATENT DOCUMENT 8 |
|---|---|---|---|
| YEAR OF PUBLICATION | — | 2002 | 2000 |
| SUPPLY VOLTAGE (V) | 1.0 | 5.0 | 1.0 |
| FREQUENCY (kHz) FOR AUTO-ZERO OPERATION | <0.001 | 7.5 | — |
| CHOPPING FREQUENCY (kHz) | 1000 | 15 | — |
| PSD ($nV/\sqrt{Hz}$) OF INPUT NOISE | 50 | 20 | 360 |
| POWER CONSUMPTION (mW) | 0.5 | 4.0 | 0.2 |
| CHIP AREA ($mm^2$) | 0.88 | 0.67 | 0.81 |
| UNITY GAIN BANDWIDTH (MHz) | 100 | 2.5 | 2.1 |
| FOM ($\times 10^3$) | 45 | 18.7 | 17.1 |

OFFSET CANCELLATION FOR AUTO-ZERO OPERATION INTERVAL

US 7,336,123 B2

CHOPPER AMPLIFIER CIRCUIT APPARATUS OPERABLE AT LOW VOLTAGE UTILIZING SWITCHED OPERATIONAL AMPLIFIER

BACKGROUND OF THE INVENTION

1. Field of the Invention

The present invention relates to a chopper amplifier circuit apparatus which is formed by, for example, a CMOS circuit, is constituted by utilizing a switched operational amplifier and a chopper modulator, and is operable at a low voltage.

2. Description of the Related Art

Recently, a sensor chip employing a mixed signal CMOS technique has been applied to detection and monitoring of a biological function (See first and second non-patent documents described below, for example). A low noise amplifier is one of the most important circuits in the sensor chip, since the sensor chip detects a low-level signal. However, in the scaled CMOS technique, increase in a direct-current (DC) offset voltage and increase in a low frequency (1/f) noise lead to a serious problem.

Auto-zero operation and chopper stabilization are techniques widely used to reduce these noises (See a third non-patent document described below, for example). Principles of these techniques are shown in FIGS. 15 to 20. FIG. 15 is a circuit diagram showing a configuration of an operational amplifier circuit including an auto-zero operational circuit which is one of principles of noise reduction techniques according to a prior art. FIG. 16 is a timing chart showing control signals φ1 and φ2 for use in the operational amplifier circuit of FIG. 15 for offset cancellation.

Referring to FIG. 15, the operational amplifier circuit including the auto-zero operational circuit is constituted by including a differential operational amplifier 50, an operational amplifier 51, a sample-hold circuit 52 and an adder 53 for forming the auto-zero operational circuit, an adder 54 for adding a DC offset Voff and a 1/f noise Vfn to the output signal from the adder 53, and four switches 55 to 58 operating in response to the control signals φ1 and φ2 for the offset cancellation.

Referring to FIG. 16, the control signal φ2 has a high level only during an offset cancellation interval, and the control signal φ1 becomes the high level from a low level after the end of the offset cancellation interval. According to the auto-zero operation technique, noises such as the DC offset Voff and the 1/f noise Vfn at zero input are sampled, and thereafter, a noise effect caused by a feedback is subtracted from an input signal by the auto-zero operational circuit constituted by the operational amplifier 51, the sample-hold circuit 52, and the adder 53. The auto-zero operation technique thus makes it possible to reduce the low-frequency noises of the amplifier circuit, however, one problem of the auto-zero operation technique is to increase in a baseband noise floor caused by aliasing of a broadband noise unique to a sampling process.

FIG. 17 is a circuit diagram showing a configuration of a chopper amplifier circuit of an operational amplifier including a chopper stabilizing circuit, which is one of the principles of noise reduction techniques according to the prior art. FIG. 18 is a timing chart showing control signals φ1 and φ2 for use in the operational amplifier circuit of FIG. 17 for chopper modulation and chopper demodulation. Referring to FIG. 18, the control signals φ1 and φ2 have a predetermined chopper frequency fc and are complementarily to each other. In this case, a chopper cycle Tc is a reciprocal of the chopper frequency fc. In addition, FIG. 19 is a diagram showing a frequency characteristic of an input voltage signal Vin(f) inputted to the chopper amplifier circuit of FIG. 17, FIG. 20 is a diagram showing a frequency characteristic of an input voltage signal V(f) inputted to an operational amplifier 60 of the chopper amplifier circuit of FIG. 17, and FIG. 21 is a diagram showing a frequency characteristic of an output voltage signal Vout(f) outputted from a chopper demodulator 62 of the chopper amplifier circuit of FIG. 17, and a frequency characteristic of an output voltage signal outputted from a low-pass filter 63.

Referring to FIG. 17, the chopper amplifier circuit is constituted by including a differential operational amplifier 60, a chopper modulator 61 which is provided at the previous stage of the operational amplifier 60 and constituted by four switches 71 to 74, an adder 64 which is provided at the previous stage of the operational amplifier 60 for adding the DC offset Voff and the 1/f noise Vfn to the output signal from the chopper modulator 61, the chopper demodulator 62 which is provided at the subsequent stage of the operational amplifier 60 and constituted by four switches 81 to 84, and the low-pass filter 63 which is provided at the subsequent stage of the chopper demodulator 62 and inserted at a final stage of the chopper amplifier circuit for extracting a desired input signal. According to the chopper stabilization based on a modulation technique, a chopper-modulated signal is obtained by converting a frequency range of an input signal having a frequency spectrum of FIG. 19 into a higher frequency range by the chopper modulator 61 (See FIG. 20). The DC offset Voff and the 1/f noise Vfn are added to the chopper-modulated signal at the previous stage of the operational amplifier 60. A resultant chopper-modulated signal is amplified by the operational amplifier 60, is chopper-demodulated by the chopper demodulator 62, and is processed by the low-pass filter 63 so as to obtain an input signal that is an original baseband signal (See FIG. 21). It is noted that a level of the 1/f noise Vfn is smaller than that of a thermal noise. In the chopper amplifier circuit, a large energy due to by the low-frequency noise is generated by the chopper demodulation using the chopping frequency fc, however, a cleaner output signal can be obtained by using the low-pass filter 63 employed in the chopper stabilization technique.

A combination of the auto-zero operation technique and the chopper stabilization technique can contribute to reduce the baseband noise floor and modulation noise at the chopper frequency, since the auto-zero operation eliminates the DC offset and the chopper stabilization reduces the baseband noise (See a fourth non-patent document described below, for example).

The following prior art documents are related to the present invention:

(1) first non-patent document: K. D. Wise, "Wireless implantable Microsystems: Coming breakthroughs in health care", Symposium on VLSI Circuits Digest of Technical Papers, pp. 106-109, June 2002;

(2) second non-patent document: T. Yoshida et al., "A design of neural signal sensing LSI with multi-input-channels", IEICE Transactions Fundamentals, Vol. E87-A, No. 2, pp. 376-383, February 2004;

(3) third non-patent document: C. C. ENZ et al., "Circuit Techniques for Reducing the Effects of Op-Amp Imperfections: Autozeroing, Correlated Double Sampling, and Chopper Stabilization", Proceedings of the IEEE, Vol. 84, No. 11, pp. 1584-1614, November 1996;

(4) fourth non-patent document: A. T. K. Tang, "A 3 µV-Offset Operational Amplifier with 20 nV/$\sqrt{Hz}$ Input Noise PSD at DC Employing both Chopping and Autozeroing", ISSCC Digest of Technical Papers, pp. 386-387, February 2002;

(5) fifth non-patent document: A. M. Abo et al., "A 1.5-V, 10-bit 14.3-MS/s CMOS pipeline analog-to-digital converter", Journal of Solid State Circuits, Vol. 34, No. 5, pp. 599-606, May 1999;

(6) sixth non-patent document: V. Cheung et al., "A 1V CMOS Switched-Opamp Switched-Capacitor Pseudo-2-Path Filter", ISSCC Digest of Technical Papers, pp. 154-155, February 2000;

(7) seventh non-patent document: Q. Huang, C. Menolfi, "A 200 nV offset 6.5 nV/√Hz Noise PSD 5.6 kHz Chopper Instrumentation Amplifier in 1 μm Digital CMOS", ISSCC Digest of Technical Papers, pp. 362-363, February 2001; and (8) eighth non-patent document: J. F. Duque-Carrillo et al., "1-V Rali-to Rali Operational Amplifiers in Standard CMOS Technology", Journal of Solid State Circuits, Vol. 35, No. 1, pp. 33-44, January 2000.

The above-mentioned two techniques are required for a low noise amplifier operating at a low voltage, however, it is difficult to apply the two techniques to the low noise amplifier by utilizing an ordinary analog switch. The reason for the difficulty is that the analog switch cannot transmit an intermediate voltage level by using a low power source voltage. In order to solve this problem of the analog switch, a clock signal boosting technique (See the fifth non-patent document, for example) and a switched operational amplifier technique (See the sixth non-patent document, for example) have been developed. The above-mentioned reason will be described below in detail with reference to FIGS. 22 and 23.

FIG. 22 is a circuit diagram showing a configuration of a CMOS analog switch circuit according to a prior art. FIG. 23 is a graph showing operation of the CMOS analog switch circuit of FIG. 22 and conductances Gp and Gn of respective MOSFETs P101 and N101 with respect to an input voltage Vin. The conductance Gp of the P channel MOSFET P101 and the conductance Gn of the N channel MOSFET N101 which constitute the CMOS analog switch of FIG. 22, decrease at the input voltage near Vdd/2 even in an ON-state when a power source voltage Vdd is reduced to, for example, one volt, and this leads to that the analog switch can not turned on. Under these conditions, there was such a problem that it was difficult to realize an electronic circuit utilizing the analog switch such as an A/D converter, a D/A converter or a DC amplifier circuit.

Namely, in recent fine CMOS processing, the power source voltage Vdd is gradually made lower according to a device scaling law, however, a threshold voltage Vth of a CMOS device is not made lower in order to reduce the power consumption during standby of a large-scaled digital circuit. For example, in a CMOS process with the power source voltage Vdd of 1.0 V and the threshold voltage Vth of 0.5 V, a floating analog switch is put into an off-state when the input signal has an intermediate electric potential, and then, a chopper circuit for switching over among signal paths cannot be realized (See FIGS. 22 and 23). In order to realize the analog switch operating even at a low power source voltage, there have been a boot-strapping technique for boosting a gate voltage of a transistor and a low threshold voltage device for use in analog circuits. However, in the former case, such a device is required that has a withstand voltage higher than that of an ordinary device, and this causes problems complication of process, deterioration in reliability, and an increase in circuit area. In addition, in the latter case, there are problems of an increase in a leakage current and deterioration in reliability.

SUMMARY OF THE INVENTION

An essential object of the present invention is to provide a chopper amplifier circuit apparatus capable of solving the above-described problems, having a simpler circuit configuration, having a higher reliability, and being operable at a lower voltage as compared with those of the prior art.

According to one aspect of the present invention, a chopper amplifier circuit apparatus includes a first chopper modulator device, an amplifying device, a chopper demodulator device, and a second chopper modulator device. The first chopper modulator device chopper-modulates an input signal according to a predetermined control signal, and outputting a chopper-modulated signal. The amplifying device has an input terminal, inputs the chopper-modulated signal outputted from the first chopper modulator device via the input terminal, amplifying the chopper-modulated signal, and outputs an amplified chopper-modulated signal. The chopper demodulator device has an output terminal, chopper-demodulates the amplified chopper-modulated signal outputted from the amplifying device according to the control signal, and outputs a demodulated output signal from the output terminal as an output signal chopper-amplified by the chopper amplifier circuit. The second chopper modulator device has an input terminal, inputs a demodulated signal outputted from the chopper demodulator device via the input terminal, chopper-modulating the demodulated signal according to the control signal, and outputs a chopper-modulated signal to the input terminal of the amplifying device.

The above-mentioned chopper amplifier circuit apparatus preferably further includes a switch device and a capacitor device inserted between the output terminal of the chopper demodulator device and the input terminal of the second chopper modulator device. The switch device executes an auto-zero operation by inputting a signal outputted from the amplifying device to the input terminal of the amplifying device during an auto-zero operation interval prior to a chopper amplification interval. The capacitor device accumulates and holds an offset voltage at the output terminal of the chopper demodulator device during the auto-zero operation interval, and then cancels an offset voltage at the input terminal of the amplifying device by an accumulated and held offset voltage.

In addition, the above-mentioned chopper amplifier circuit apparatus preferably further includes a low-pass filter device for passing therethrough an amplified input signal by low-pass-filtering the output signal outputted from the chopper demodulator device so as to pass therethrough a frequency band of the input signal.

Further, the above-mentioned chopper amplifier circuit apparatus is preferably constituted as a fully-differential amplifier circuit apparatus, and further includes a common mode feedback circuit. The common mode feedback circuit generates a feedback signal fed back to the input terminal of the amplifying device so that a level of the output signal outputted from the chopper demodulator device becomes a predetermined reference value in a common mode, based on a fully-differential output signal outputted from the chopper demodulator device.

Still further, the above-mentioned chopper amplifier circuit apparatus is preferably formed by a CMOS circuit.

In addition, the above-mentioned chopper amplifier circuit apparatus preferably further includes a replica circuit having a bias voltage generator circuit formed in a manner similar to that of the amplifying device, the replica circuit generating a bias voltage of the amplifying device and supplying the bias voltage to the amplifying device.

Further, in the above-mentioned chopper amplifier circuit apparatus, the chopper demodulator device is preferably formed by a CMOS output buffer circuit.

Therefore, according to the chopper amplifier circuit apparatus according to the present invention, an output signal from the chopper demodulator device is chopper-modulated by the second chopper modulator device, and then is fed back to the input terminal of the amplifying device. Therefore, it is possible to provide a chopper amplifier circuit apparatus having a simpler circuit configuration, having a higher reliability, and being operable at a lower voltage as compared with those of the prior art. In addition, the chopper amplifier circuit apparatus is provided with a circuit for the auto-zero operation, and therefore, a DC offset can be appropriately performed on the input signal, and the low frequency noise can be reduced.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 14 is a table showing comparison of the operational amplifier of the present preferred embodiment with an operational amplifier of each non-patent document;

DETAILED DESCRIPTION OF THE PREFERRED EMBODIMENTS

Preferred embodiments according the present invention will be described below with reference to the drawings. In the attached drawings, the same numerical references denote components similar to each other.

First Preferred Embodiment

Figure 1:
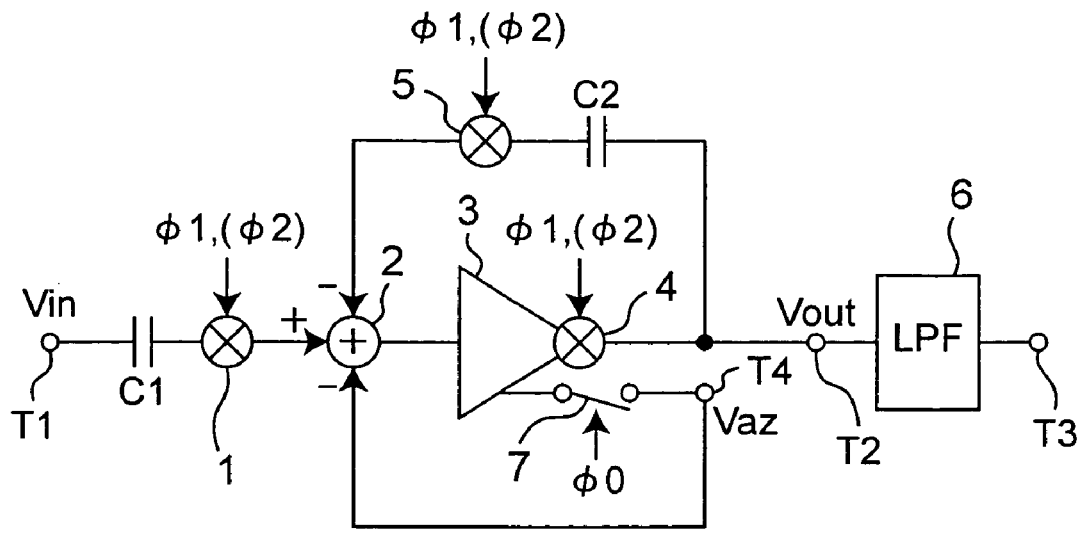
FIG. 1 is a block diagram showing a configuration of a chopper amplifier circuit according to a first preferred embodiment of the present invention.
Figure 2:
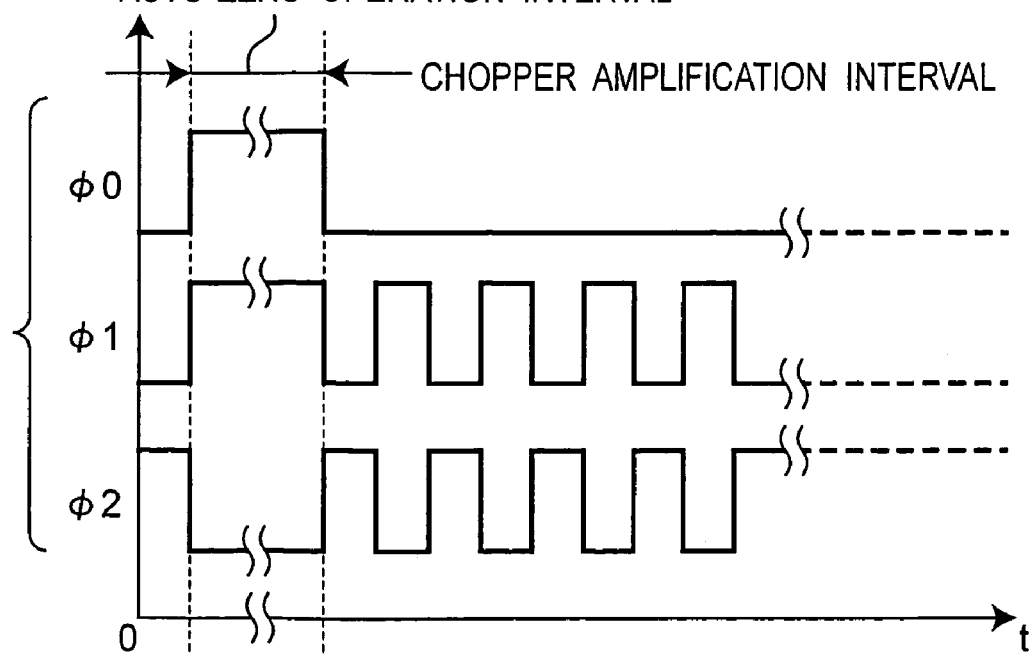
FIG. 2 is a timing chart showing control signals $\phi 0$, $\phi 1$, and $\phi 2$ for use in the chopper amplifier circuit of FIG. 1.

FIG. 1 is a block diagram showing a configuration of a chopper amplifier circuit according to the first preferred embodiment of the present invention. FIG. 2 is a timing chart showing control signals $\phi 0$, $\phi 1$, and $\phi 2$ for use in the chopper amplifier circuit of FIG. 1. The chopper amplifier circuit according to the first preferred embodiment is a low noise amplifier operating at a low power source voltage based on auto-zero operation and chopper stabilization. In a low voltage operation of the chopper stabilization, an input voltage level is unstable, and therefore, the chopper modulator 61 and the chopper demodulator 62 according to the prior art cannot be implemented in floating analog switches.

In order to solve this problem, the chopper amplifier circuit according to the present preferred embodiment is characterized by including a switched operational amplifier 3 having a negative feedback as shown in FIG. 1.

Referring to FIG. 1, the chopper amplifier circuit according to the first preferred embodiment is constituted by including a chopper modulator 1, an adder 2, the switched operational amplifier 3 including a chopper demodulator 4 provided at a final stage thereof, a chopper modulator 5 for a negative feedback circuit, a low-pass filter 6, an input terminal T1, an intermediate output terminal T2, an output terminal T3, a coupling capacitor C1, a capacitor C2 for the negative feedback circuit, and a switch 7 and a terminal T4 for the auto-zero operation. Referring to FIG. 2, during an offset sampling (which is preferably a time interval of 1 to 5 μsec and executed at a frequency of 1 Hz or less), or during an auto-zero operation interval, the control signal φ0 indicating an interval during which the switch 7 is turned on and the control signal φ1 for the chopper modulation and the chopper demodulation become both a high level, while the control signal φ2 which is a complementary signal to the control signal φ1 becomes a low level. Next, in a chopper amplification interval, the control signal φ0 holds the low level, the control signal φ1 becomes a repeating rectangular pulse signal, and the control signal φ2 becomes a repeating rectangular pulse signal which is a complementary signal to the control signal φ1. In the present preferred embodiment, one of the control signals φ1 and φ2 may be used as a chopper control signal for each of the chopper modulators 1 and 5 and the chopper demodulator 4.

Referring to FIG. 1, an input signal Vin, which is either a DC signal or a low frequency signal inputted to the input terminal T1, is inputted to the chopper modulator 1 of is a multiplier via the coupling capacitor C1. The chopper modulator 1 multiplies the input signal Vin by the control signal φ1 (or φ2), and outputs a chopper-modulated signal indicating a multiplication result to the adder 2. During the offset sampling for the auto-zero operation interval, the adder 2 subtracts an auto-zero operation offset signal, which is fed back via the switch 7 and the terminal T4, from the chopper-modulated signal. In addition, during the chopper amplification interval, the adder 2 subtracts a chopper-modulated signal, which is outputted from the chopper modulator 5 of the negative feedback circuit, from the chopper-modulated signal, and thereafter, the adder 2 outputs a signal indicating a subtraction result to the switched operational amplifier 3.

The switched operational amplifier 3 is constituted by including an input stage, a phase compensation amplifying stage, an auto-zero operation output stage, and a final stage including the chopper demodulator 4 for the chopper demodulation. The switched operational amplifier 3 amplifies an inputted signal with phase-compensating the inputted signal, then chopper-demodulates an amplified signal according to the control signal φ1 (or φ2), and outputs an output signal Vout after the chopper demodulation to the low-pass filter 6 via the intermediate output terminal T2. In addition, the switched operational amplifier 3 outputs the output signal Vout to the chopper modulator 5 via the capacitor C2 for the negative feedback circuit. In this case, the capacitor C2 accumulates and holds a DC offset voltage at an output terminal of the chopper demodulator 4 during the auto-zero operation interval so as to cancel an offset voltage at an input terminal of the switched operational amplifier 3 during the chopper amplification interval after the auto-zero operation interval by the DC offset voltage accumulated and held in the capacitor C2. In addition, an output signal outputted from the auto-zero operation output stage of the switched operational amplifier 3 is fed back to the adder 2 as an auto-zero operation signal Vaz, via the switch 7, which is turned on only during the offset sampling for the auto-zero operation interval, and the terminal T4. The chopper modulator 5 chopper-modulates a feed back signal from the capacitor C2 according to the control signal φ1 (or φ2), and thereafter, outputs a resultant signal to the adder 2. Further, the low-pass filter 6 low-pass-filters the output signal Vout inputted thereto via the intermediate output terminal T2 so as to pass therethrough only a desired frequency component of the input signal, and outputs the low-pass-filtered output signal to the terminal T3 as an amplified input signal.

Figure 17:
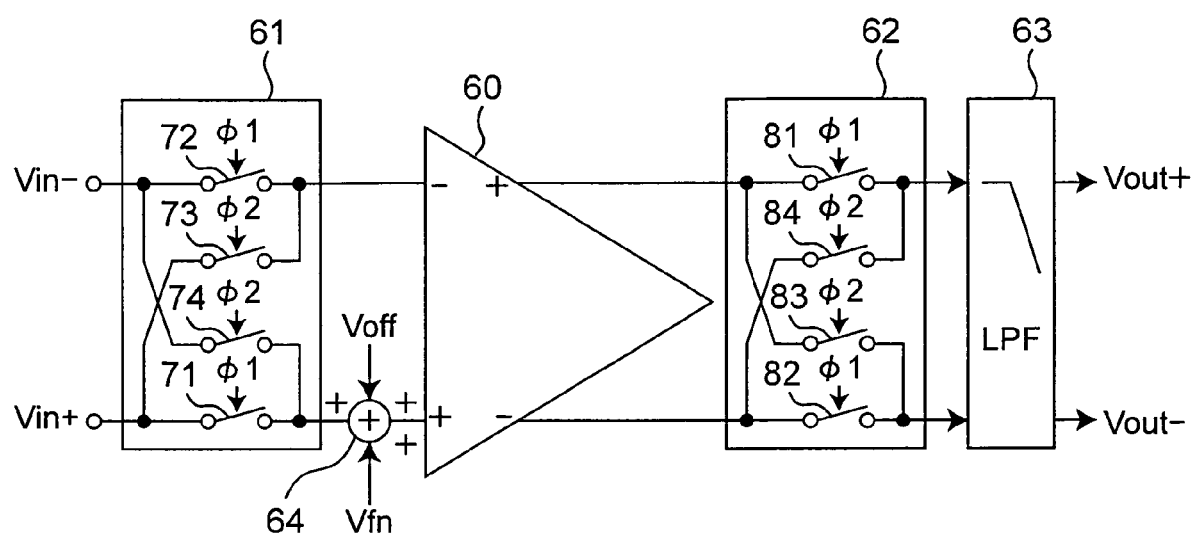
FIG. 17 is a circuit diagram showing a configuration of a chopper amplifier circuit of an operational amplifier including a chopper stabilizing circuit, which is one of the principles of noise reduction techniques according to the prior art.
Figure 18:
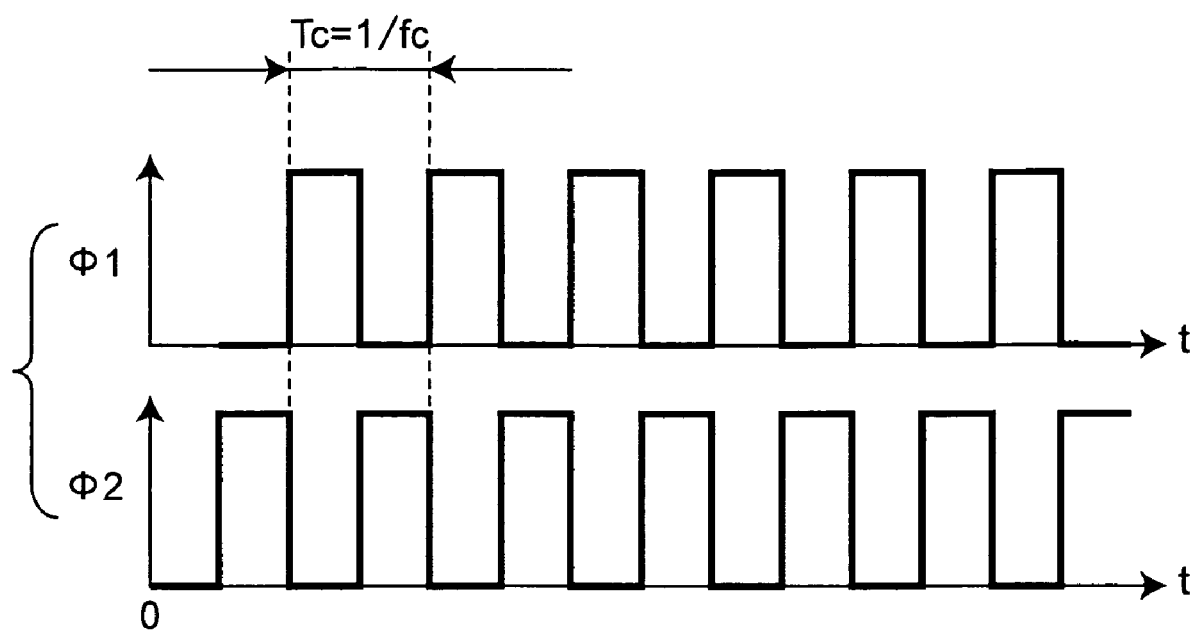
FIG. 18 is a timing chart showing control signals $\phi 1$ and $\phi 2$ for use in the operational amplifier of FIG. 17 for chopper modulation and chopper demodulation.
Figure 19:
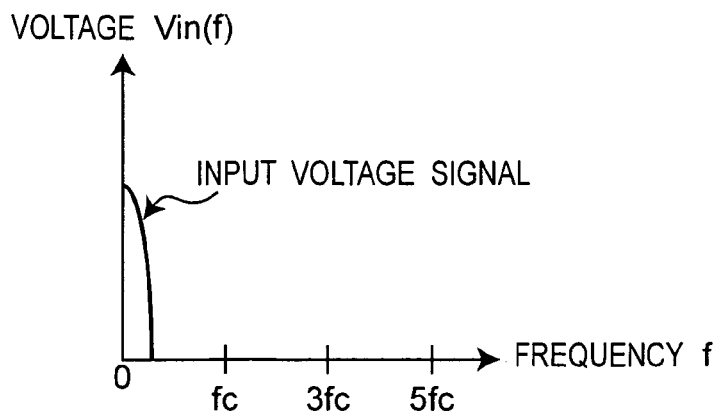
FIG. 19 is a diagram showing a frequency characteristic of an input voltage signal Vin(f) inputted to the chopper amplifier circuit of FIG. 17.
Figure 20:
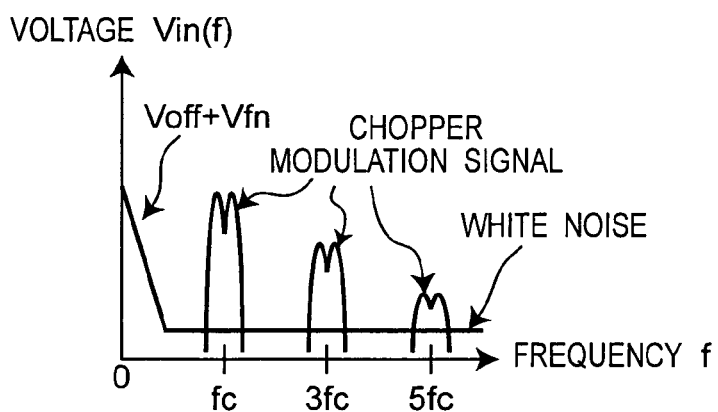
FIG. 20 is a diagram showing a frequency characteristic of an input voltage signal V(f) inputted to an operational amplifier 60 of the chopper amplifier circuit of FIG. 17.
Figure 21:
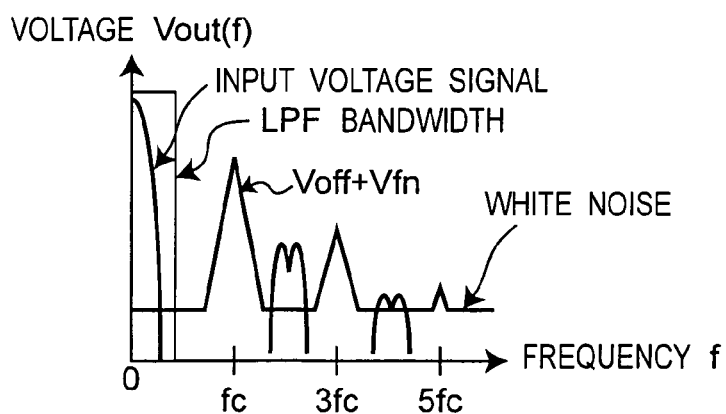
FIG. 21 is a diagram showing a frequency characteristic of an output voltage signal Vout(f) outputted from a chopper demodulator 62 of the chopper amplifier circuit of FIG. 17, and a frequency characteristic of an output voltage signal outputted from a low-pass filter 63.
Figure 22:
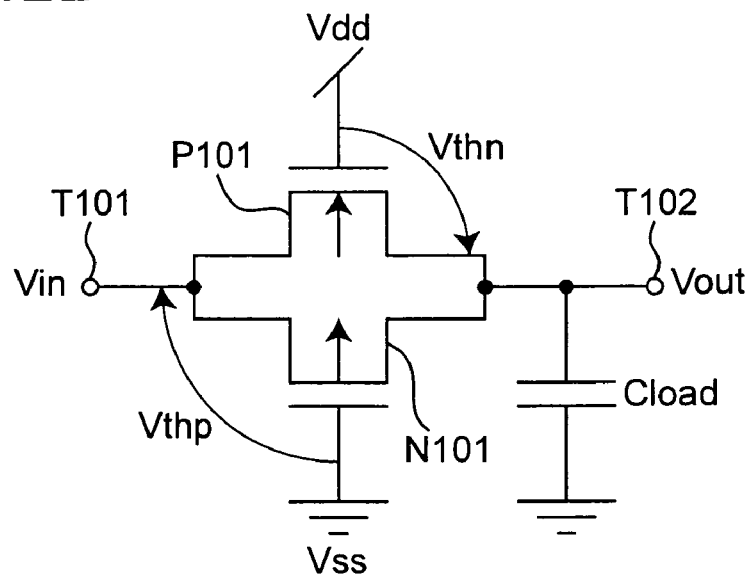
FIG. 22 is a circuit diagram showing a configuration of a CMOS analog switch circuit according to a prior art.
Figure 23:
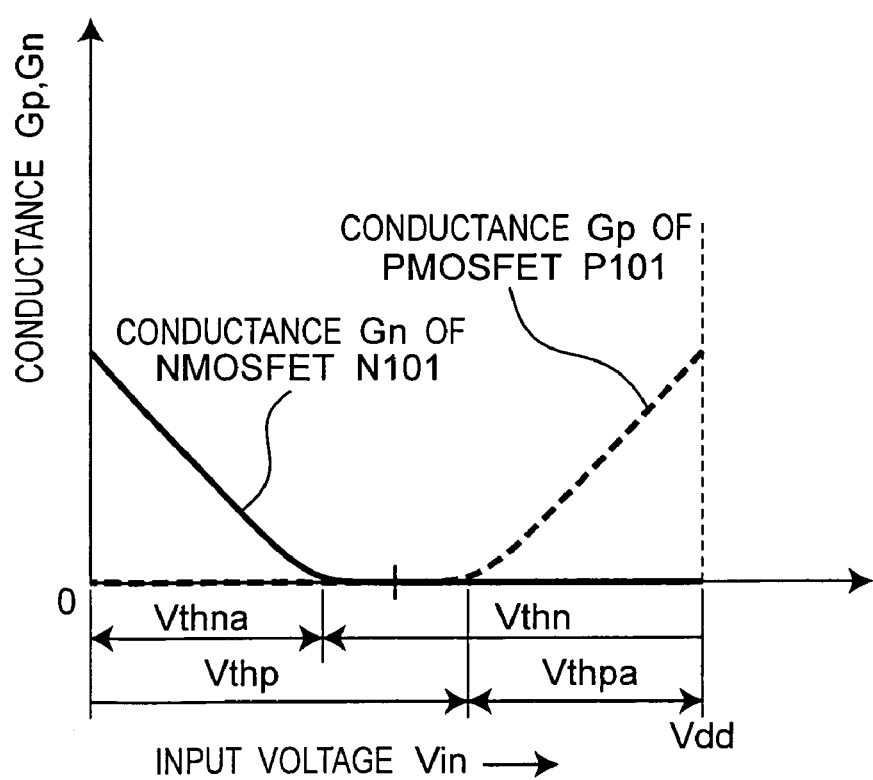
FIG. 23 is a graph showing operation of the CMOS analog switch circuit of FIG. 22 and conductances Gp and Gn of respective MOSFETs P101 and N101 with respect to an input voltage Vin.

It is noted that the respective switches of the chopper modulators 1 and 5 and the chopper demodulator 4 are similar to the switches 71 to 74 and 81 to 84 of FIG. 17, and each of them can be formed by using a CMOS circuit, for example.

According to the chopper amplifier circuit according to the first preferred embodiment constituted as described above, the output signal outputted from the chopper demodulator 4 of the switched operational amplifier 3 is chopper-modulated by the chopper modulator 5, and then, is fed back to the input terminal of the switched operational amplifier 3. Accordingly, it is possible to provide a chopper amplifier circuit apparatus having a simpler circuit configuration, having a higher reliability, and being operable at a lower voltage as compared with those of the prior art. Further, since the chopper amplifier circuit according to the present preferred embodiment is provided with the auto-zero operation circuit, it is possible to appropriately perform the DC offset on the input signal and reduce the low frequency noise.

Second Preferred Embodiment

Figure 3:
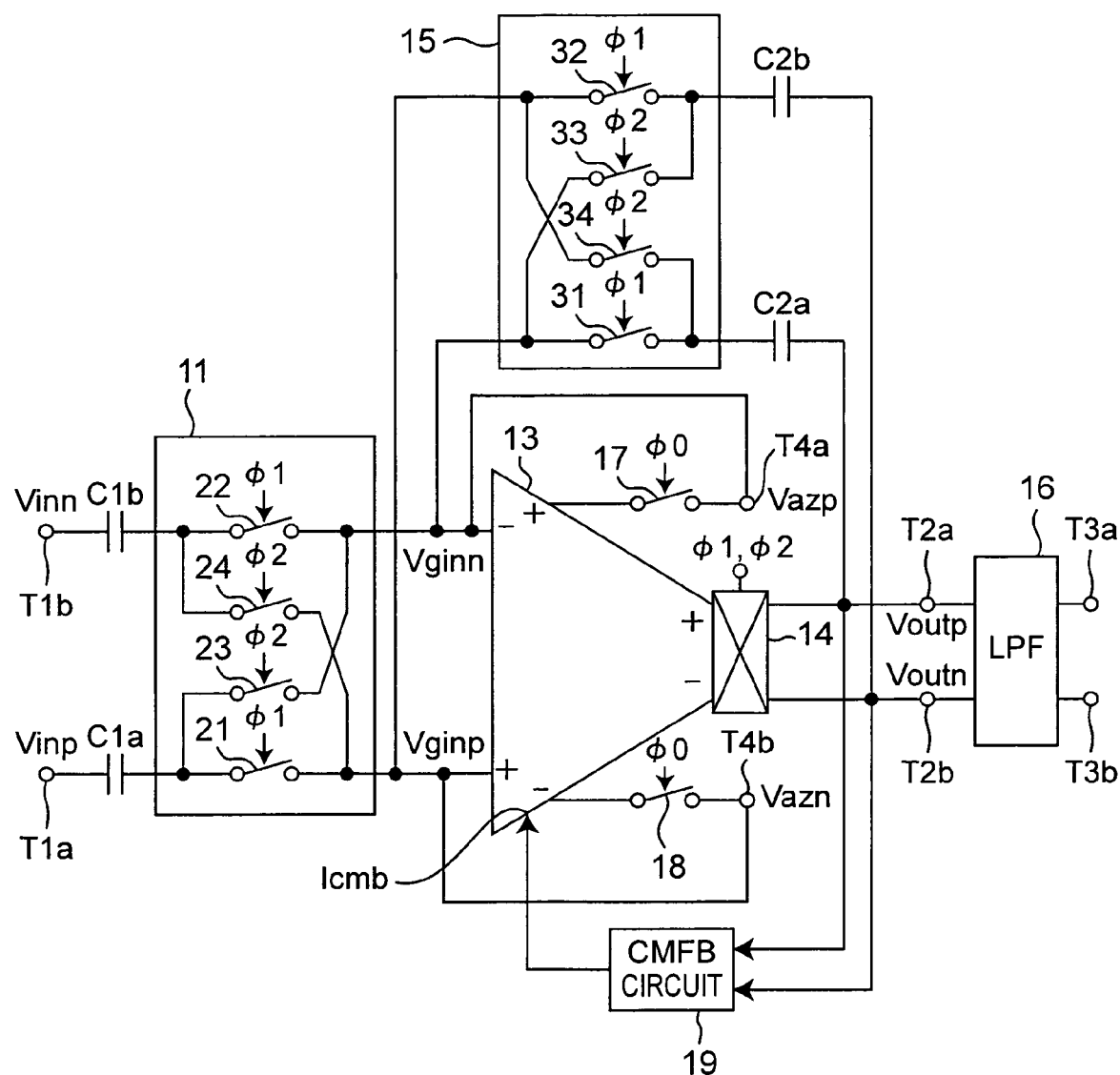
FIG. 3 is a block diagram showing a configuration of a chopper amplifier circuit according to a second preferred embodiment of the present invention.

FIG. 3 is a block diagram showing a configuration of a chopper amplifier circuit according to the second preferred embodiment of the present invention. Referring to FIG. 3, the chopper amplifier circuit according to the second preferred embodiment is characterized by realizing the chopper amplifier circuit according to the first preferred embodiment using a fully-differential amplifier. The present chopper amplifier circuit is constituted by including a chopper modulator 11, a switched operational amplifier 13, a chopper modulator 15 for a negative feedback circuit, a low-pass filter 16, a common mode feedback circuit (referred to as a CMFB circuit hereinafter) 19, input terminals T1a and T1b, intermediate output terminals T2a and T2b, output terminals T3a and T3b, coupling capacitors C1a and C1b, capacitors C2a and C2b for the negative feedback circuit, switch circuits 17 and 18 for auto-zero operation, and terminals T4a and T4b. The switched operational amplifier 13 is a fully-differential two-input four-output amplifier provided with a chopper demodulator 14 at a final stage thereof. Referring to FIG. 3, during an offset sampling (which is preferably a time interval of 1 to 5 μsec and executed at a frequency of 1 Hz or less), or during an auto-zero operation interval, a control signal φ0 indicating an interval during which the switch circuits 17 and 18 are both turned on and a control signal φ1 for the chopper modulation and the chopper demodulation become the high level, while a control signal φ2 which is a complementary signal to the control signal φ1 becomes the low level. Next, in a chopper amplification interval, the control signal φ0 holds the low level, the control signal φ1 becomes a repeating rectangular pulse signal, and the control signal φ2 becomes a repeating rectangular pulse signal which is a complementary signal to the control signal φ1.

Referring to FIG. 3, a positive-side input signal Vinp, which is either a DC signal or a low frequency signal inputted to the input terminal T1a, is inputted to the chopper modulator 11 via the coupling capacitor C1a. On the other hand, a negative-side input signal Vinn, which is either a DC signal or a low frequency signal inputted to the input terminal T1b, is inputted to the chopper modulator 11 via the coupling capacitor C1b. The chopper modulator 11 is constituted by four switches 21 to 24, each of which is turned on and off according to the control signal φ1 or φ2 in a manner similar to that of the prior art. The chopper modulator 11 chopper-modulates inputted differential signals, then outputs a resultant positive-side chopper-modulated signal Vginp to a non-inverting input terminal of the switched operational amplifier 13, and outputs a resultant negative-side chopper-modulated signal Vginn to an inverting input terminal of the switched operational amplifier 13.

Figure 4:
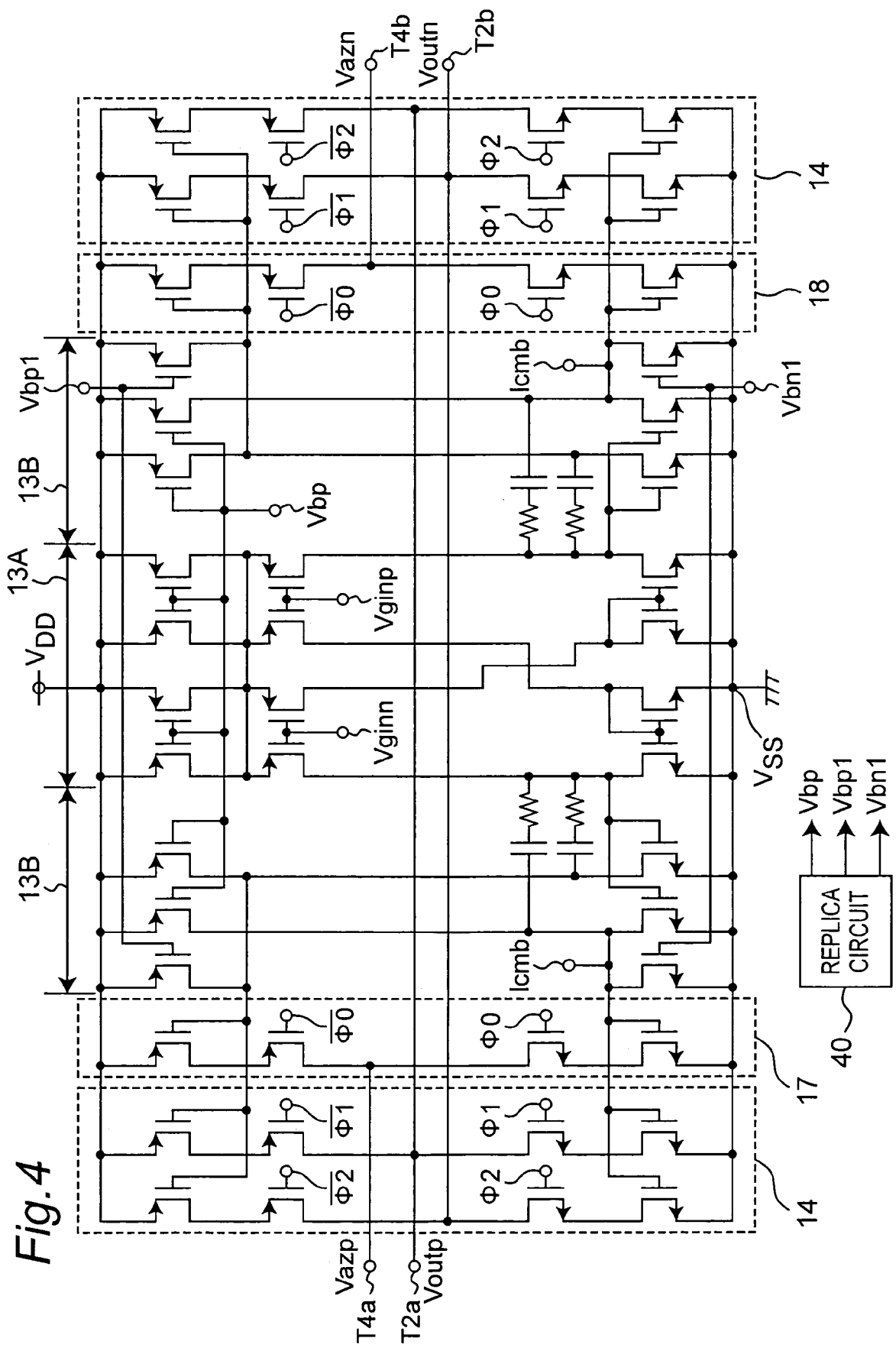
FIG. 4 is a circuit diagram showing a main part circuit including a switched operational amplifier 13, an auto-zero operation switch circuits 17 and 18, and a chopper demodulator 14 of FIG. 3.

As shown in FIG. 4, for example, the switched operational amplifier 13 is constituted by including an input circuit 13A that constitutes an input interface circuit, phase compensation amplifier circuits 13B, the switch circuits 17 and 18 for the auto-zero operation, and the chopper demodulator 14 for the chopper demodulation provided at the final stage of the switched amplifier 13. The switched operational amplifier 13 inputs inputted signals via the input circuit 13A, amplifies the inputted signals with phase-compensating them by the phase compensation amplifier circuits 13B, and thereafter, chopper-demodulates resultant signals by the chopper demodulator 14 according to the control signals φ1 and φ2. The switched operational amplifier 13 outputs a chopper-demodulated positive-side output signal Voutp to the low-pass filter 16 via the intermediate output terminal T2a, and outputs the same signal to the chopper modulator 15 via the capacitor C2a for the feedback circuit. In addition, the switched operational amplifier 13 outputs a chopper-demodulated negative-side output signal Voutn to the low-pass filter 16 via the intermediate output terminal T2b, and outputs the same signal to the chopper modulator 15 via the capacitor C2b for the feedback circuit. In this case, the chopper demodulator 14 is constituted by four switches, each of which is turned on and off according to the control signals φ1 and φ2 in a manner similar to that of the chopper demodulator 62 of FIG. 17. In addition, the capacitors C2a and C2b accumulate and hold DC offset voltages across at output terminals of the chopper demodulator 14, respectively, during the auto-zero operation interval, so as to cancel offset voltages across input terminals of the switched operational amplifier 13 during the chopper amplification interval after the auto-zero operation interval, by the DC offset voltages accumulated and held in the capacitors C2a and C2b, respectively. In addition, as will be described later in detail, the chopper demodulator 14 can realize the chopper amplifying function by making NMOS switches of a CMOS buffer output circuit operating in a class such as a class AB, switch over between the input signals according to the control signals φ1 and φ2.

In addition, a positive-side output signal outputted from an auto-zero operation output stage of the switched operational amplifier 13 via the switch circuit 17, which is turned on only during the offset sampling or the auto-zero operation interval, is fed back to the inverting input terminal of the switched operational amplifier 13 via the terminal T4a as an auto-zero operation signal Vazp. In addition, a negative-side output signal outputted from the auto-zero operation output stage of the switched operational amplifier 13 via the switch circuit 18, which is turned on only during the offset sampling or the auto-zero operation interval, is fed back to the non-inverting input terminal of the switched operational amplifier 13 via the terminal T4b as an auto-zero operation signal Vazn.

Further, the chopper modulator 15 is constituted by four switches 31 to 34, each of which is turned on and off according to the control signal φ1 or φ2 in a manner similar to that of the prior art. The chopper modulator 15 chopper-modulates inputted differential input signals and feeds back resultant signals to the input terminals of the switched operational amplifier 13, respectively. Namely, the chopper modulator 15 outputs a resultant positive-side chopper-modulated signal to the inverting input terminal of the switched operational amplifier 13, and outputs a resultant negative-side chopper-modulated signal to the non-inverting input terminal of the switched operational amplifier 13. Further, the low-pass filter 16 low-pass-filters the differential output signals Voutp and Voutn outputted via the intermediate output terminals T2a and T2b so as to pass therethrough only desired frequency components of input signals, and outputs low-pass-filtered output signals to the terminals T3a and T3b as amplified input signals, respectively.

Further, the CMFB circuit 19 performs the common mode feedback by generating a feedback signal so that a predetermined long-time average of a differential signal of the two differential output signals Voutp and Voutn outputted from the chopper modulator 15 of the switched operational amplifier 13 becomes a predetermined reference voltage Vref based on these differential output signals Voutp and Voutn, and feeding back a generated feedback signal to an Icmb terminal (See FIG. 4) at an intermediate stage of the switched operational amplifier 13 under current source control.

It is noted that the respective switches of the chopper modulators 11 and 15 and the chopper demodulator 14 are those similar to the switches 71 to 74 and 81 to 84 of FIG. 17, and each can be formed by using, for example, an NMOS field effect transistor of a CMOS circuit.

Figure 5:
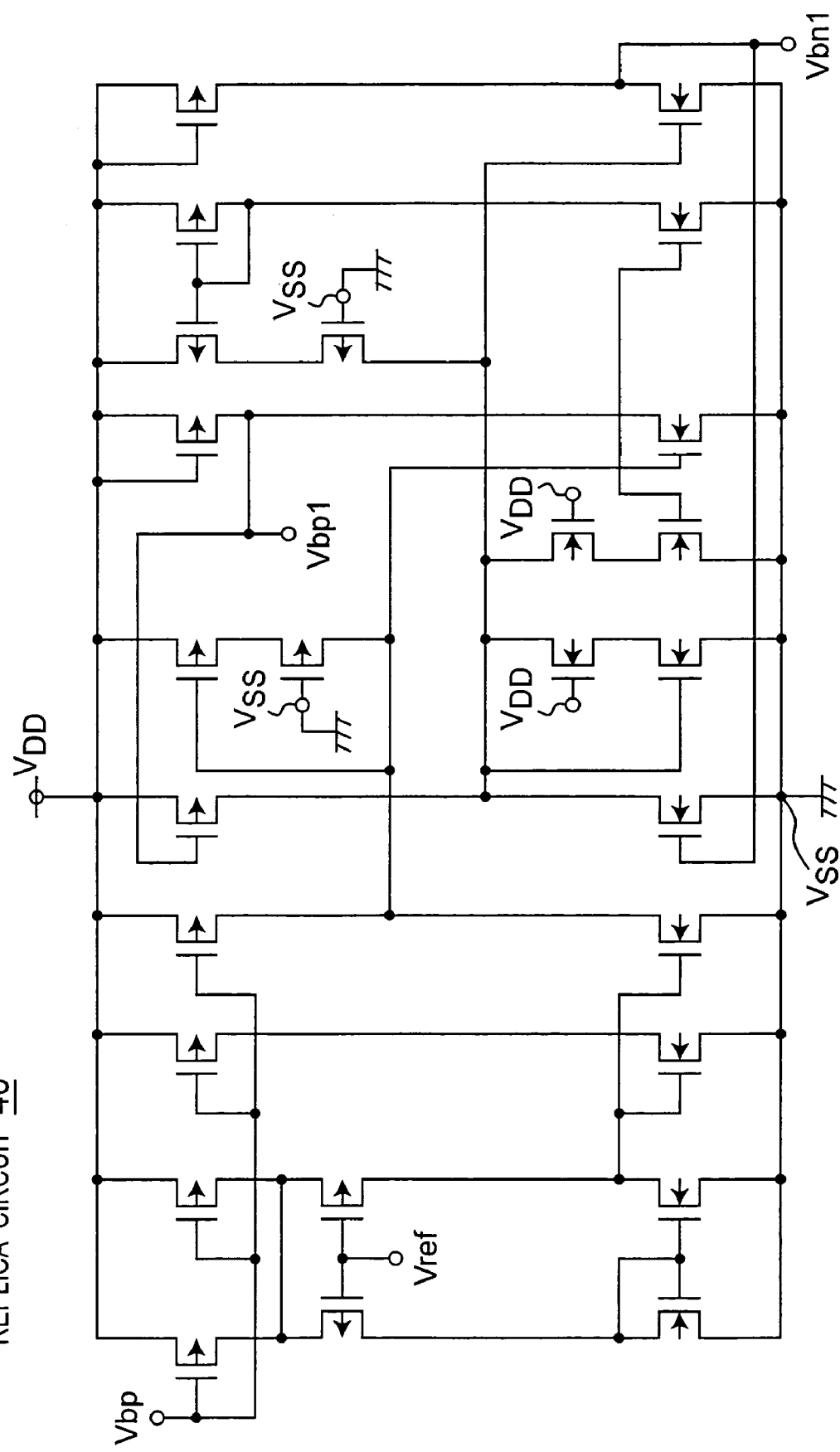
FIG. 5 is a circuit diagram showing a replica circuit 40 for the main part circuit of FIG. 4.

FIG. 4 is a circuit diagram showing a main part circuit including the switched operational amplifier 13, the switch circuits 17 and 18 for the auto-zero operation, and the chopper demodulator 14 of FIG. 3. FIG. 5 is a circuit diagram showing a replica circuit 40 for the main part circuit of FIG. 4. As shown in FIG. 4, the main part circuit includes the input circuit 13A that constitutes the input interface circuit, the phase compensation amplifier circuits 13B, the switch circuits 17 and 18 for the auto-zero operation, and the chopper demodulator 14 for the chopper demodulation provided at the final stage. The main part circuit is constituted by a CMOS circuit which is many combinations of the PMOS and NMOS field effect transistors, resistors for the phase compensation, and capacitors. An approximate left side part of the FIG. 4 shows a circuit for processing the positive-side signal, and an approximate right side part of the FIG. 4 shows a circuit for processing the negative-side signal.

As shown in FIG. 3, the chopper modulators 11 and 15 are realized by, for example, the NMOS field effect transistors using a virtual ground, by means of the simple analog switches 21 to 24 and 31 to 34, respectively. This is because a voltage level of the virtual ground can be set to an arbitrary level (near 0.25 V close to a grounding electric potential VSS, for example), and an amplitude of an input signal is relatively small. In an architecture of the chopper amplifier circuit according to the present preferred embodiment, in order to modulate the output signals demodulated by the chopper demodulator 14, it is necessary to insert the additional chopper modulator 15 to a feedback loop circuit, however, an incremental area of the chopper modulator 15 is almost negligible. On the other hand, the chopper demodulator 14 located outside of the virtual ground cannot be formed by the analog switches since an output amplitude of the chopper demodulator 14 is relatively large. Accordingly, the chopper demodulator 14 is provided to be included at the final stage of the switched operational amplifier 13, and a concrete circuit configuration of the chopper demodulator 14 is shown in FIG. 4.

In addition, the multiple-output switched operational amplifier 13 includes the switch circuits 17 and 18 for the auto-zero operation. During the auto-zero interval when the control signal φ0 has the high level, the output signals outputted from the switched operational amplifier 13 are fed back to the input terminals of the switched operational amplifier 13 from the switch circuits 17 and 18 of FIG. 3 via the terminals T4a and T4b as the auto-zero operation signals Vazp and Vazn, respectively, so as to form a voltage follower circuit. A path of the auto-zero operation is activated during an initial high level interval when the control signal φ0 has the high level (the auto-zero operation interval). In addition, electric charges of the DC offset voltages detected at the respective output terminals of the chopper demodulator 14 are accumulated and held in the hold capacitors C2a and C2b. Due to this auto-zero operation, during the chopper amplification interval after the auto-zero operation interval, the offset voltages at the input terminals of the switched operational amplifier 13 is canceled out by the DC offset voltages accumulated and held in the respective capacitors C2a and C2b. When the offset sampling is executed periodically, the low frequency noise can be reduced. Namely, output signals of the auto-zero operation are the signals Vazp and Vazn for sampling the input signals using the offset voltages of their own during the high level interval when the control signal φ0 has the high level. The chopper demodulator 14 constituted by four output buffer circuits includes two output terminals Voutp and Voutn. In addition, these output signals are chopper-demodulated according to the control signals φ1 and φ2 so as to obtain original baseband input signals.

As shown in FIG. 4, the fully-differential switched operational amplifier 13 consists of three stages. The input circuit 13A of the first stage is implemented by using source coupled pairs of the PMOS field effect transistors, where respective sources of one pair thereof are coupled to each other. Each of the phase compensation amplifier circuits 13B of the second stage is constituted by a pair of CMOS gain amplifier circuits having a common source, respectively, and separately drives a PMOS field effect transistor and an NMOS field effect transistor of the buffer circuit (in this case, including the auto-zero operation circuits 17 and 18 and the chopper demodulator 14) of the final stage. By separating the first stage from the second stage as described above, respective bias points of the PMOS field effect transistor and the NMOS field effect transistor can be set independently to each other. The chopper demodulator 14 of the final stage is constituted by a push-pull CMOS output buffer circuit including grounding switches. As shown in FIG. 4, respective bias voltages of push-pull buffer circuits including the input circuit 13A and the amplifier circuits 13B are adjusted according to a replica biasing method by respective bias voltages supplied from the replica circuit 40 of FIG. 5 formed in a manner similar to that of the input circuit 13A and the amplifier circuits 13B via bias terminals Vbp, Vbp1 and Vbn1. The chopper demodulator 14 of the output buffer circuit operates in the class AB. In FIG. 5, "Vref" denotes a reference voltage at a virtual grounding point.

The replica biasing method using the replica circuit 40 is described below. In the replica circuit 40 of FIG. 5, respective PMOS field effect transistors and respective NMOS field effect transistors are formed on the same semiconductor substrate, so that each of them has a size (in this case, the size includes a gate length and a gate width, and such a description that "sizes similar to each other" means that ratios of gate length to gate width are substantially equal to each other, the same is true hereinafter) substantially the same as, similar to or analogical to a size of each of the field effect transistors of the circuits 13A and 13B of FIG. 4. In the replica circuit 40 as constituted above, a reference voltage corresponding to a predetermined operating voltage can be determined, and bias voltages Vbp, Vbp1, and Vbn1 generated in the replica circuit 40 are applied to respective corresponding bias voltage terminals in the circuits 13A and 13B of FIG. 4 as they are. Accordingly, the replica circuit 40 can supply appropriate bias voltages to the circuits 13A and 13B that are CMOS amplifier circuits of FIG. 4, respectively. Namely, such an advantageous effect is exhibited that a class AB CMOS output buffer circuit can be realized even in a low voltage circuit in which any buffer circuit cannot be realized by multiple stages of transistors. In other words, the class AB CMOS output buffer circuit according to the present preferred embodiment operates at a power source voltage equal to or lower than 1 V, and a stationary bias voltage of the class AB CMOS output buffer circuit can be arbitrarily set from an external circuit.

In the chopper amplifier circuit constituted as described above, even when the power source voltage is relatively small, the power consumption is relatively small and the distortion is reduced. In addition, as shown in FIG. 4, one pair of the collocated second-stage amplifier circuits 13B include RC serial feedback paths for phase-compensating the pair of amplifier circuits, respectively. Collocated paths for a positive-side signal and a negative-side signal generate a plurality of left half plane zeros by an open loop transfer function. Added zeros accelerate the phase-compensation in the CMOS output buffer circuit of the third stage.

Further, the stabilization of the common mode is realized by using the CMFB circuit 19, and an output level of the common mode is stabilized by a current feedback to the terminal Icmb. As will be described later in detail, results of a simulation using the CMFB circuit 19 show a DC gain of 90 dB, a phase margin of 53 degrees, and a unity gain bandwidth of 50 MHz.

As described above, in the fully-differential chopper amplifier circuit according to the present preferred embodiment, the chopper modulator 15 or the input part is provided within the feedback loop circuit, and the input voltages Vginp and Vginn at the virtual grounding points are set to near the grounding electric potential Vss (e.g., 0.25 V) so as to constitute the chopper amplifier circuit using floating analog switches (which are constituted by the NMOS field effect transistors). Since the chopper demodulator 14 of the output circuit having a large signal amplitude cannot be constituted by the analog switches, the chopper demodulator 14 is realized by switching over between outputs from multiple-output switched operational amplifier 13. According to the above described configuration, it is possible to realize the chopper amplifier circuit that reduces the 1/f noise and the DC offset voltage at a relatively low power source voltage at which ordinary analog switches cannot be used. In addition, the chopper amplifier circuit according to the present preferred embodiment has a voltage follower configuration in which the output terminals of the multiple-output switched operational amplifier 13 are connected to the input terminals of the switched operational amplifier 13, and it is also possible to realize the auto-zero operation by holding the DC offset voltages in the respective capacitors C2a and C2b, respectively.

The chopper amplifier circuit according to the second preferred embodiment constituted as described above has such a configuration that the output signals outputted from the chopper demodulator 14 of the switched operational amplifier 13 are chopper-modulated by the chopper modulator 15, and then, are fed back to the respective input terminals of the switched operational amplifier 13. Accordingly, it is possible to provide a chopper amplifier circuit apparatus having a simpler circuit configuration, having a higher reliability, and being operable at a lower voltage as compared with those of the prior art. Further, since the chopper amplifier circuit according to the present preferred embodiment is provided with the auto-zero operation circuit, it is possible to appropriately perform the DC offset on the input signal and reduce the low frequency noise.

IMPLEMENTAL EXAMPLES

Experiments on the chopper amplifier circuit (referred to as a chopper amplifier circuit according to implemental examples hereinafter) of FIG. 3 according to the preferred embodiment formed on an IC chip conducted by the inventors of the present invention and results of the experiment will described below. The inventors of the present invention manufactured a test chip of a low noise chopper amplifier circuit based on the chopper stabilization technique and the auto-zero operation technique by a 0.18-μm CMOS process (Vthn=0.42 V and Vthp=0.5 V).

Figure 6:
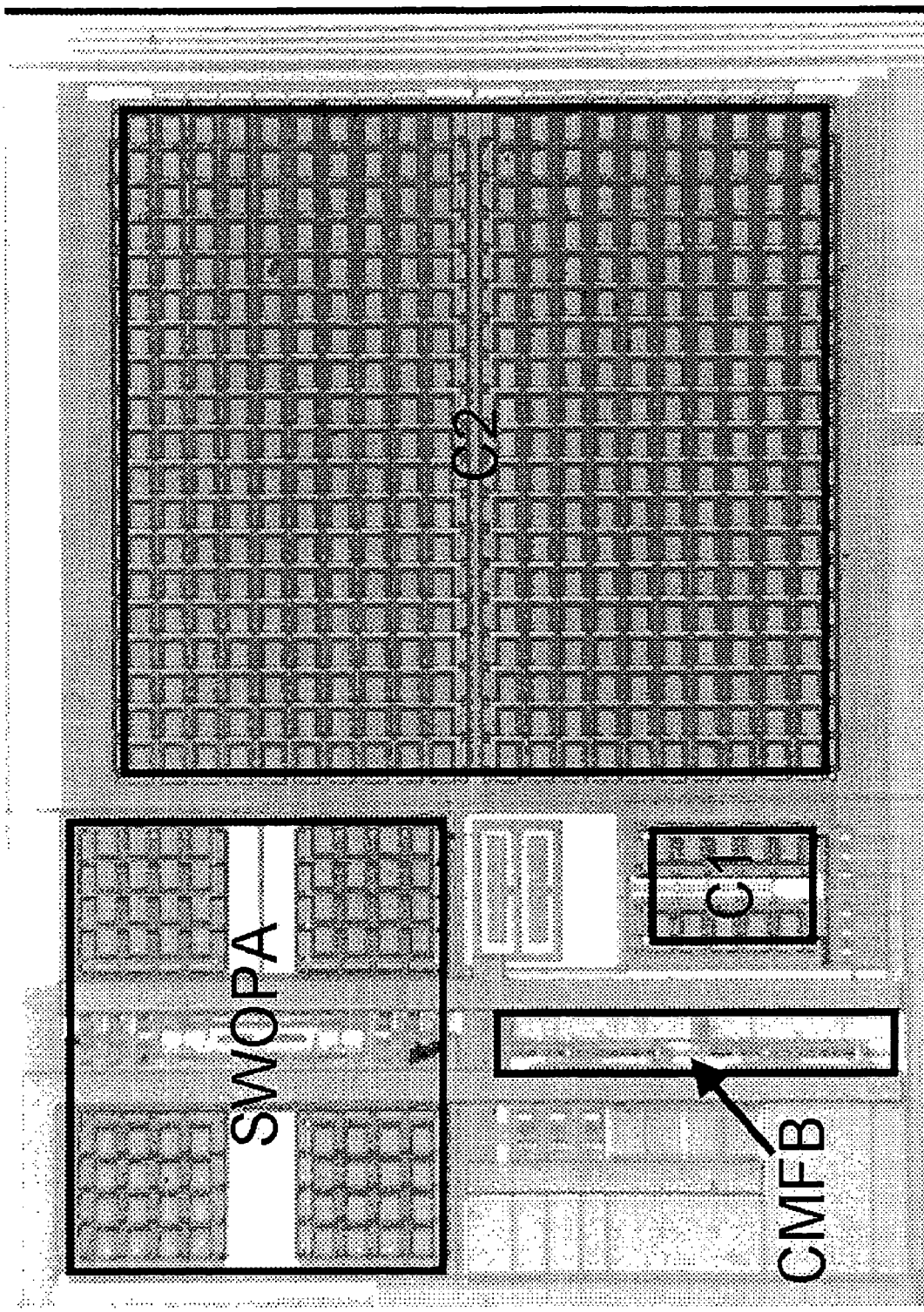
FIG. 6 is a microscopic photograph showing a top surface of the chopper amplifier circuit of FIG. 3 formed on an IC chip.

FIG. 6 is a microscopic photograph showing a top surface of the chopper amplifier circuit of FIG. 3 formed on the IC chip. In the microscopic photograph of FIG. 6, SWOPA denotes the switched operational amplifier 13, CMFB denotes the CMFB circuit 19, C1 denotes the coupling capacitors C1a and C1b, and C2 denotes the capacitors C2a and C2b inserted into the feedback circuit. A chip area of the IC chip of FIG. 6 is 1100×800 μm². In addition, the capacitors C1 and C2 having capacities of 2 pF and 80 pF, respectively, were implemented so as to obtain an accurate feedback gain.

Figure 7:
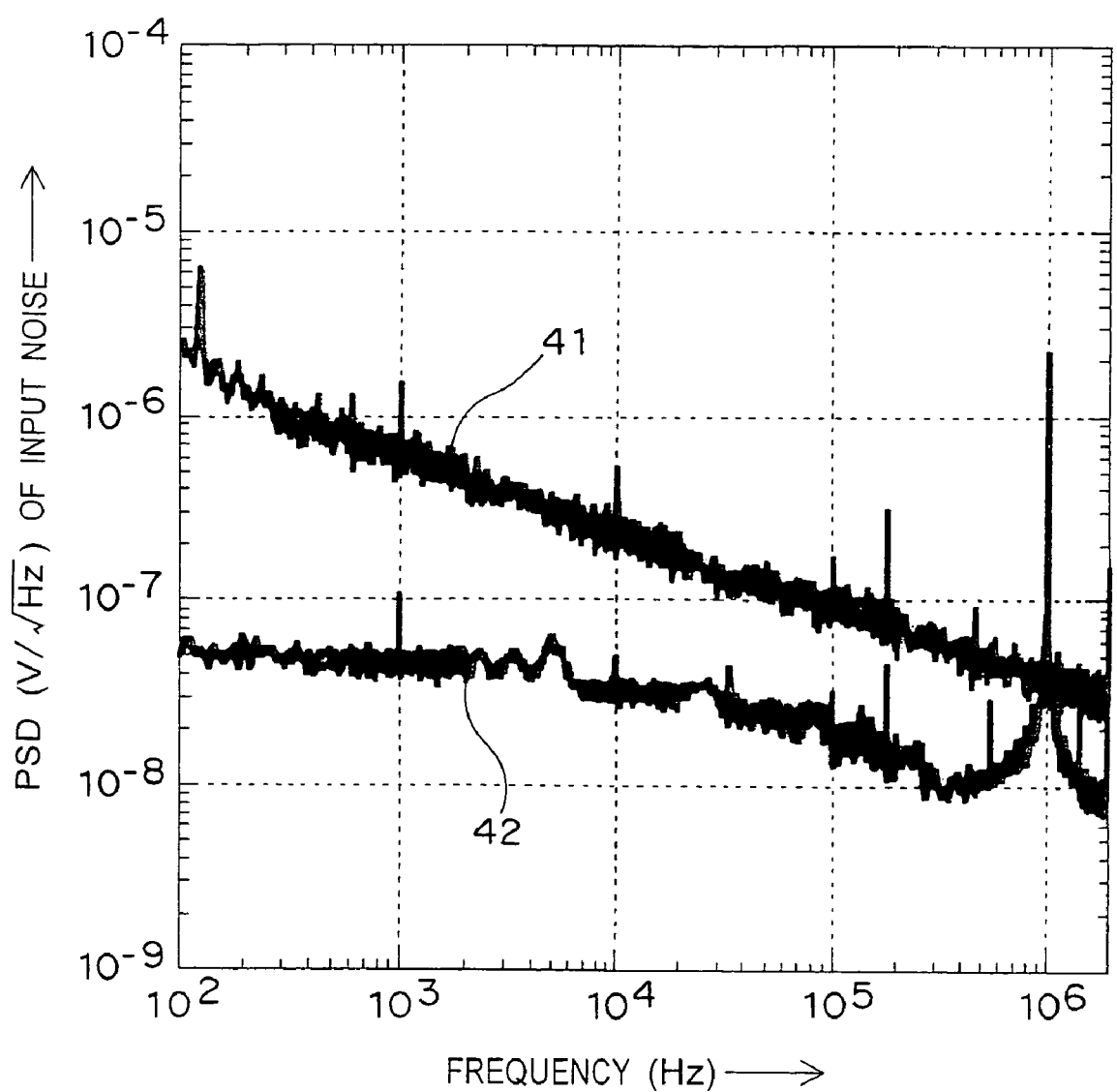
FIG. 7 is a graph showing a frequency characteristic 41 of a power spectral density (PSD) of an input noise with only a switched operational amplifier for use in the chopper amplifier circuit of FIG. 3, and a frequency characteristic 42 of a power spectral density (PSD) of an input noise in the chopper amplifier circuit stabilized by a chopper that operates using a chopping signal of 1 MHz.

FIG. 7 is a diagram showing a frequency characteristic 41 of a power spectral density (PSD) of an input noise with only the switched operational amplifier for use in the chopper amplifier circuit of FIG. 3, and a frequency characteristic 42 of a power spectral density (PSD) of an input noise in the chopper amplifier circuit stabilized by a chopper that operates using a chopping signal of 1 MHz. In the experiment of FIG. 7, the low noise amplifier operates at the power source voltage of 1 V at a chopping frequency of 1 MHz and an auto-zero operation time of 5 μsec. As apparent from FIG. 7, the input noise inputted to the switched operational amplifier 13 had a typical 1/f noise spectrum, and the PSD of the noise was 2.5 μV/√Hz at 100 Hz. The low noise chopper amplifier circuit according to the present implemental example could suppress the PSD of the noise to be less than 50 nV/√Hz.

Figure 8:
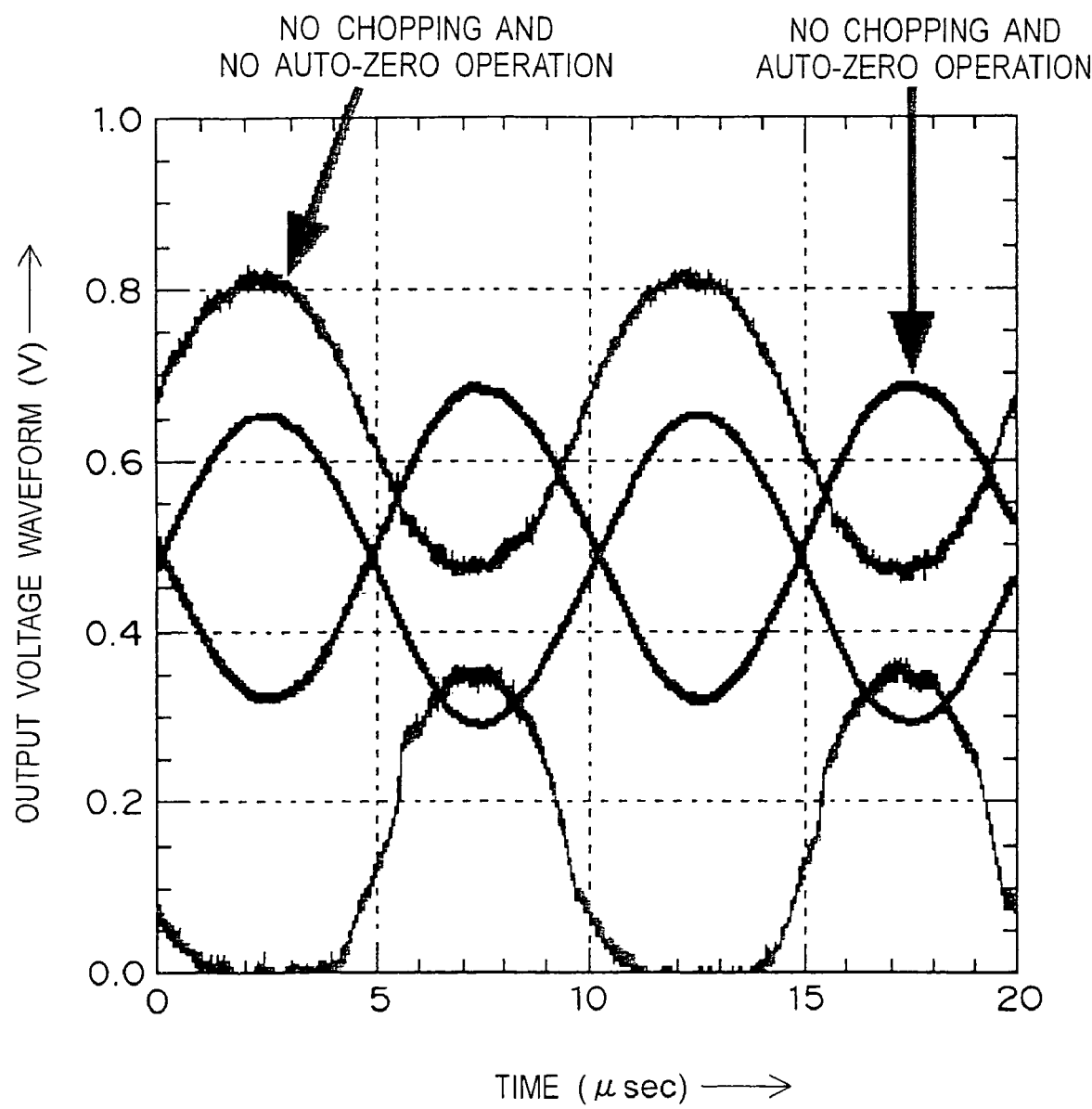
FIG. 8 is a diagram showing output voltage waveforms with no chopping and no auto-zero operation, and with no chopping and auto-zero operation in the chopper amplifier circuit of FIG. 3.
Figure 9:
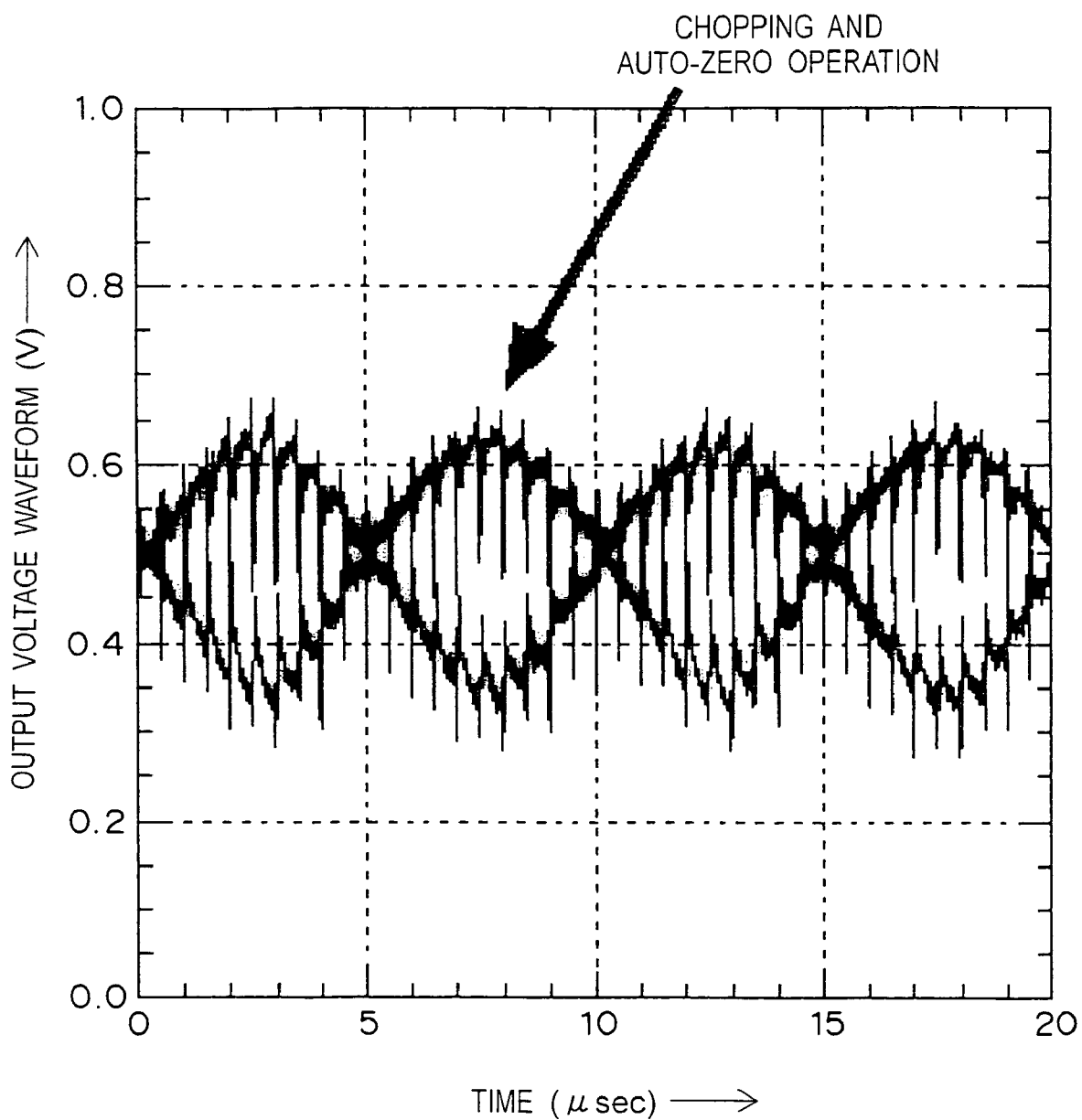
FIG. 9 is a diagram showing an output voltage waveform at the previous stage of a low-pass filter 16 with chopping and auto-zero operation in the chopper amplifier circuit of FIG. 3.

FIG. 8 is a diagram showing output voltage waveforms with no chopping and with no auto-zero operation, and with no chopping and auto-zero operation in the chopper amplifier circuit of FIG. 3. FIG. 9 is a diagram showing an output voltage waveform at the previous stage of the low-pass filter 16 with chopping and auto-zero operation in the chopper amplifier circuit of FIG. 3. Namely, in the experiments shown in FIGS. 8 and 9, output waveforms outputted from the low noise chopper amplifier circuit when the input signal has a frequency of 100 kHz and an input level of 10 mVpp are shown in FIGS. 8 and 9. As apparent from FIG. 8, the offset voltage inputted to the switched operational amplifier 13 is reduced by the auto-zero operation, and the remaining input offset and 1/f noise are eliminated by the chopping. In addition, as apparent from FIG. 9, an electric charge injection noise appears on the output waveform, however, the chopper amplifier circuit can reduce the noise by a chopper modulation having a ping pong configuration (See the fourth non-patent document, for example) or a guard time (See the seventh non-patent document, for example).

Figure 10:
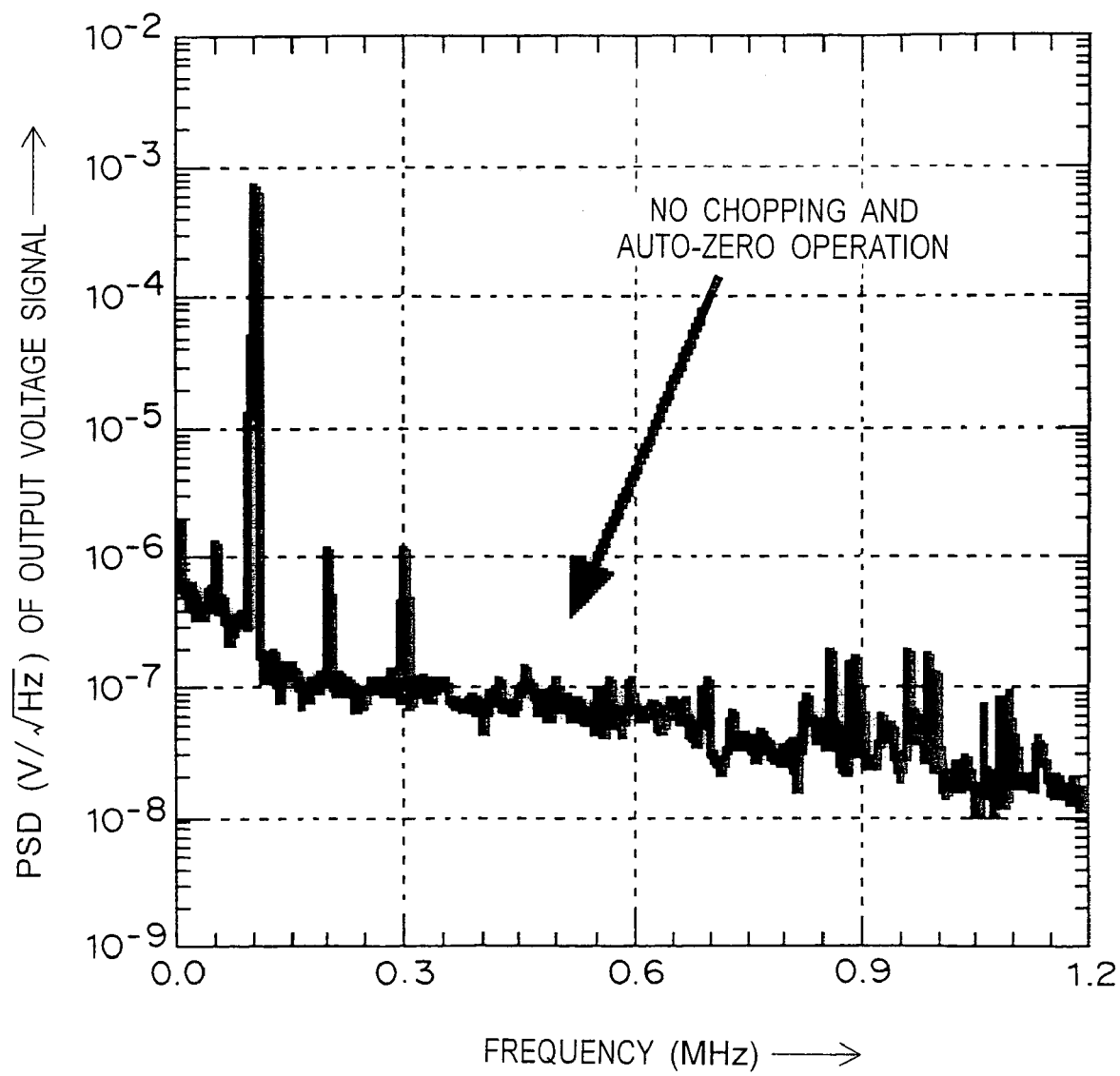
FIG. 10 is a diagram showing a frequency characteristic of a power spectral density (PSD) of an output voltage signal with no chopping and auto-zero operation in the low noise chopper amplifier circuit of FIG. 3.
Figure 11:
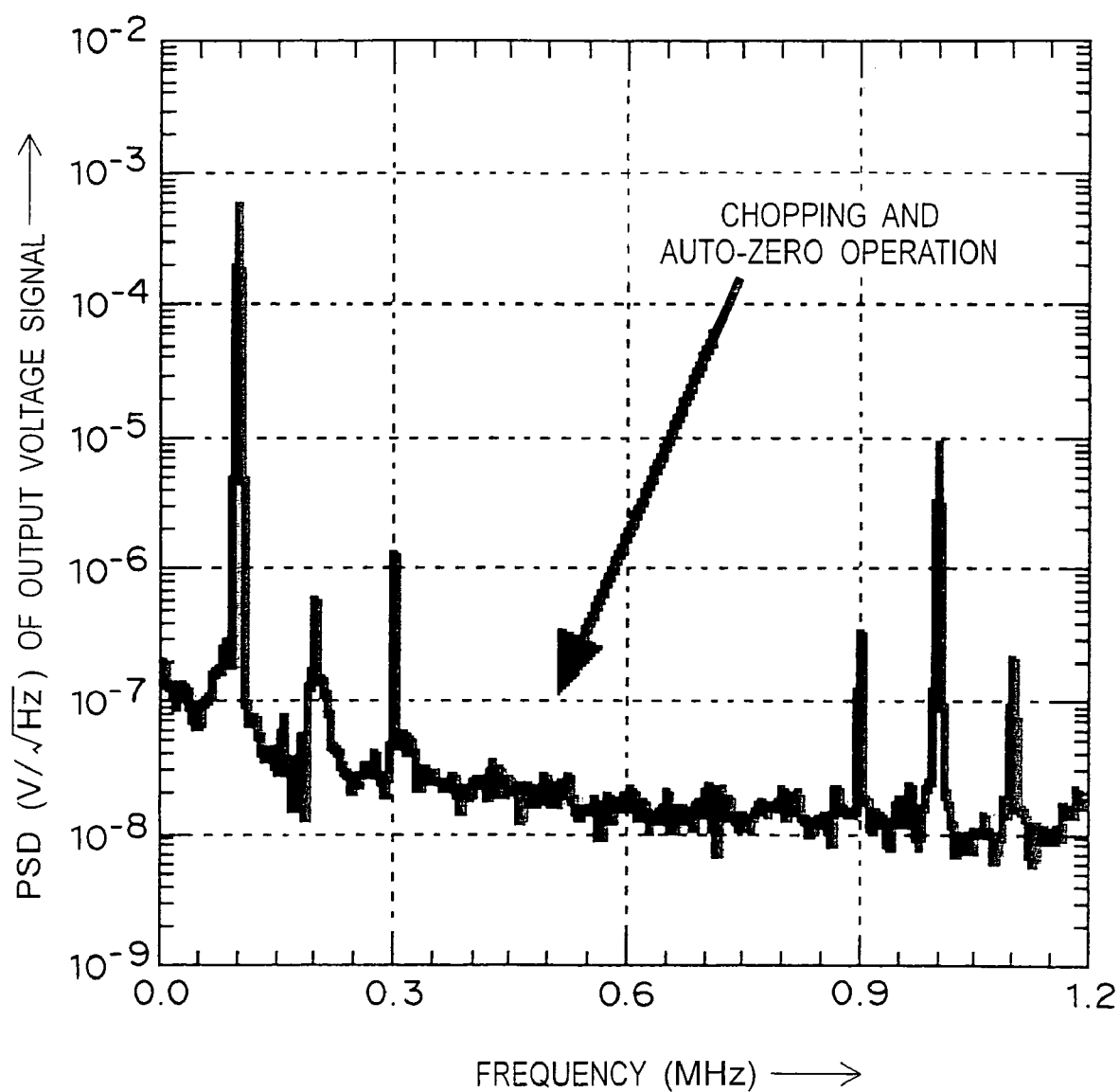
FIG. 11 is a graph showing a frequency characteristic of a power spectral density (PSD) of the output voltage signal with chopping and auto-zero operation in the low noise chopper amplifier circuit of FIG. 3.

FIG. 10 is a diagram showing a frequency characteristic of a power spectral density (PSD) of an output voltage signal with no chopping and auto-zero operation in the low noise chopper amplifier circuit of FIG. 3. In addition, FIG. 11 is a diagram showing a frequency characteristic of a power spectral density (PSD) of the output voltage signal with chopping and auto-zero operation in the low noise chopper amplifier circuit of FIG. 3. Namely, FIGS. 10 and 11 show the output power spectral density (PSD) of the low noise amplifier operating using the auto-zero operation and the chopping. As apparent from FIGS. 10 and 11, the auto-zero operation can reduce a total harmonic distortion (THD) of the amplifier circuit, and the chopping can attain a high dynamic range by reduction of the 1/f noise. The total harmonic distortion (THD) of the low noise chopper amplifier circuit using the auto-zero operation and the chopping operation is 52 dB (See FIG. 11). As apparent from FIG. 11, the output signal and the total noise up to 100 kHz are 500 mVpp and 15 μV, respectively, and therefore, the chopper amplifier circuit according to the present implemental example can attain a dynamic range of 88 dB under these conditions.

Figure 12:
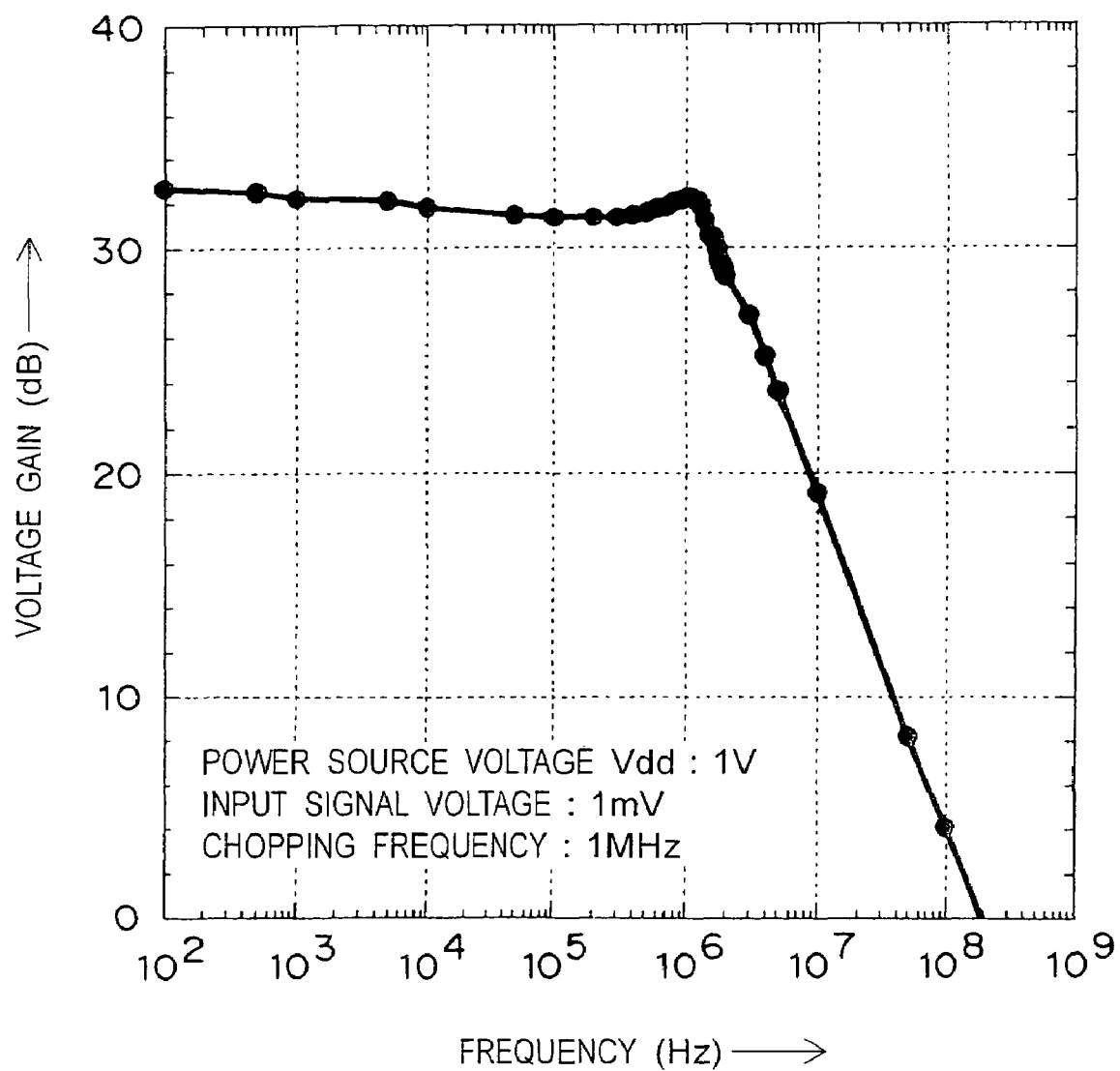
FIG. 12 is a diagram showing a frequency characteristic of a voltage gain in the low noise chopper amplifier circuit of FIG. 3.

FIG. 12 is a diagram showing a frequency characteristic of a voltage gain of the low noise chopper amplifier circuit of FIG. 3. As apparent from FIG. 12, the chopper amplifier circuit according to the present implemental example attained a voltage gain of 32 dB and a cutoff frequency of 2 MHz in a chopping operation at 1 MHz. A unity gain frequency exceeded 100 MHz.

Figure 13:
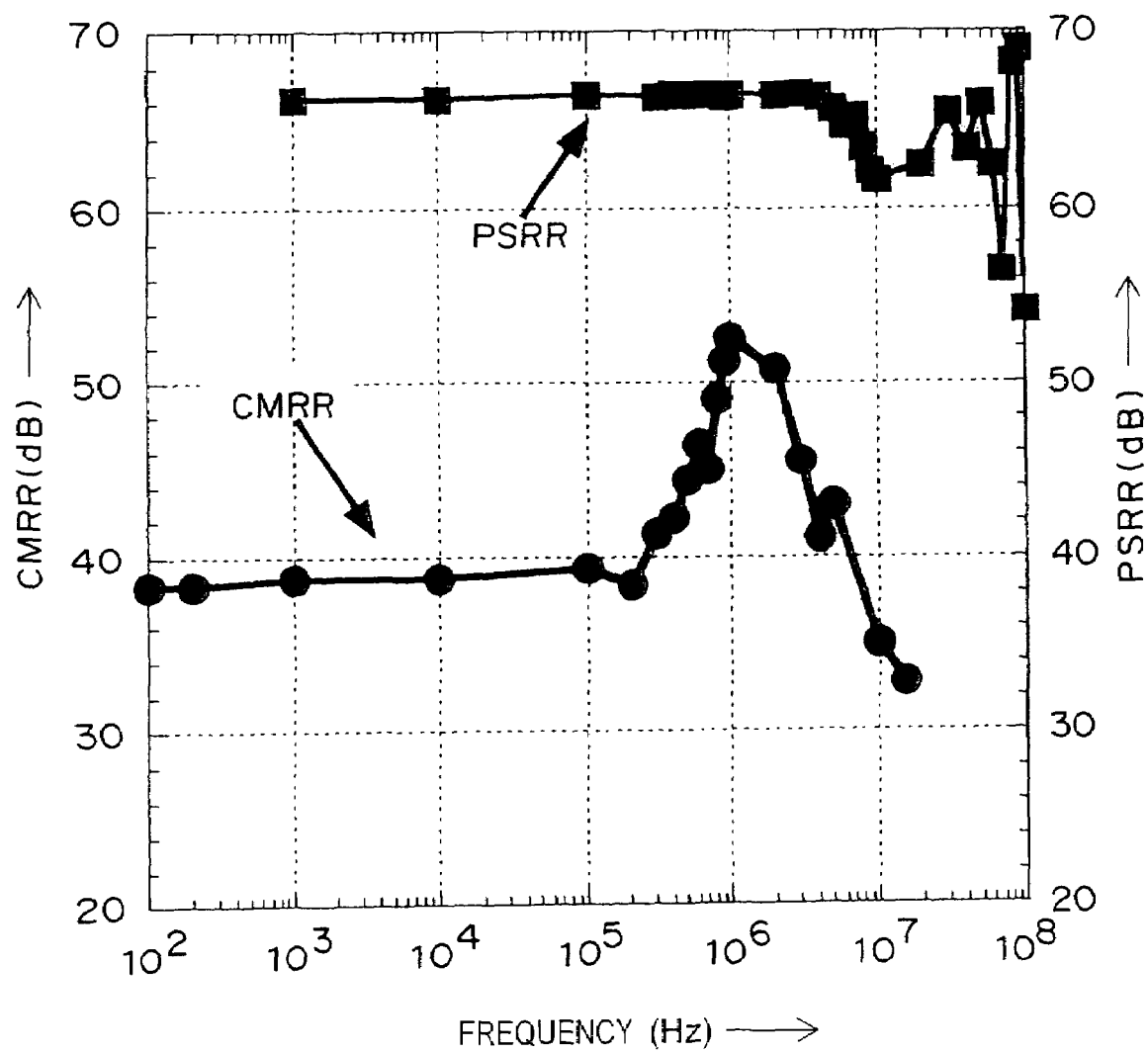
FIG. 13 is a diagram showing frequency characteristics of a common mode rejection ratio CMRR and a power source rejection ratio PSRR of the low noise chopper amplifier of FIG. 3.
Figure 15:
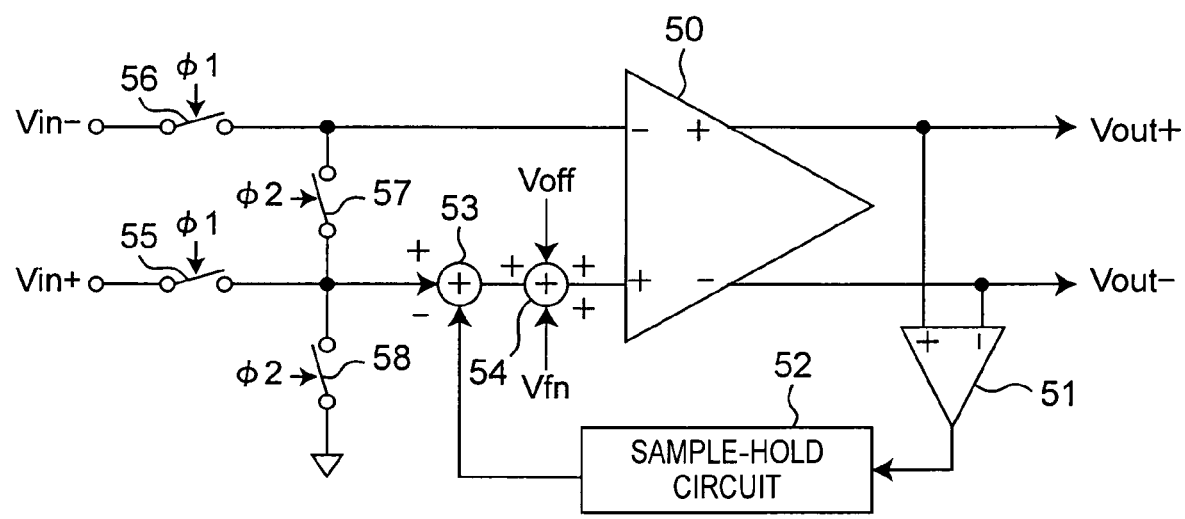
FIG. 15 is a circuit diagram showing a configuration of an operational amplifier circuit including an auto-zero operational circuit which is one of principles of noise reduction techniques according to a prior art.
Figure 16:
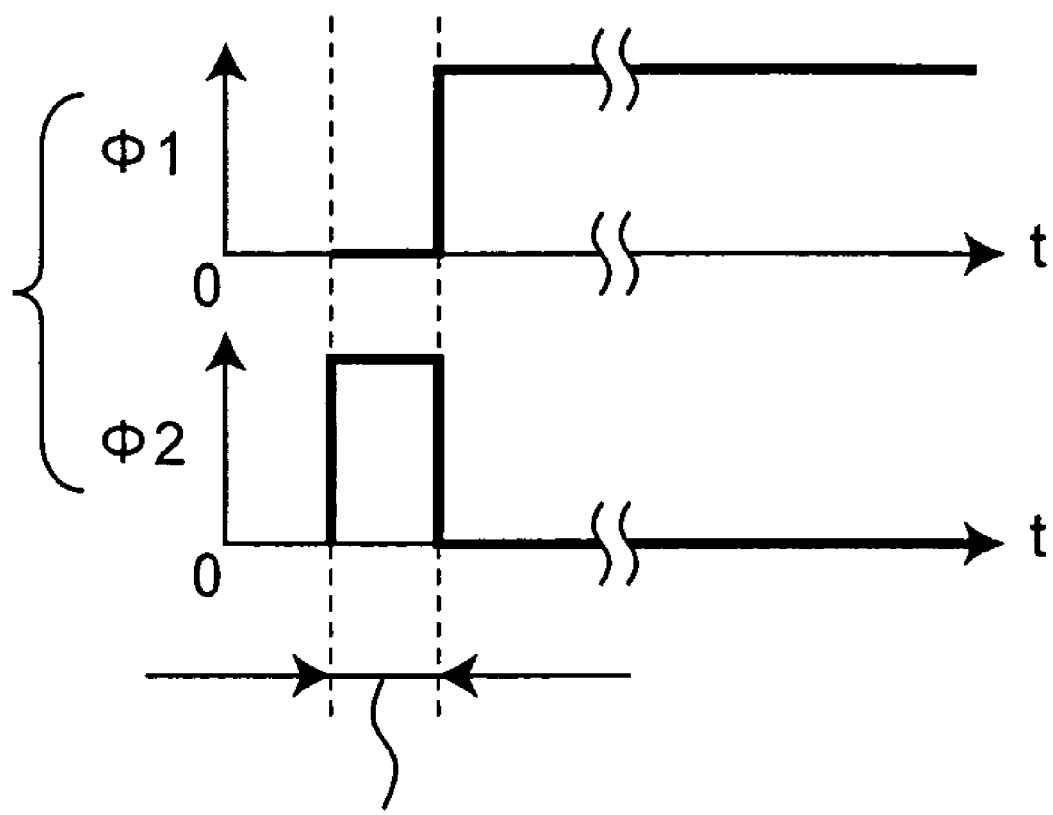
FIG. 16 is a timing chart showing control signals $\phi 1$ and $\phi 2$ for use in the operation amplifier circuit of FIG. 15 for offset cancellation.

FIG. 13 is a diagram showing frequency characteristics of a common mode rejection ratio CMRR and a power source rejection ratio PSRR of the low noise chopper amplifier of FIG. 3. As apparent from FIG. 13, the common mode rejection ration CMRR and the power source rejection ratio PSRR were 38 dB at frequencies up to 200 kHz and 66 dB at frequencies up to 500 kHz, respectively.

FIG. 14 is a table showing a comparison of the operational amplifier of the present implemental example with an operational amplifier of each non-patent document. Namely, the table of FIG. 14 shows a list of a comparison of performances of the chopper amplifier circuits according to the fourth and eighth non-patent documents with performances of the chopper amplifier circuit according to the present implemental example. Since an initially set operating time of the chopper amplifier circuit exceeds one hour, it is described in the table that a frequency for the auto-zero operation is lower than 1 Hz. Each of the chopper amplifier circuits according to the fourth and eighth non-patent documents cited focuses on the noise reduction or the operation at a low voltage. With focusing on the noise, the power and the area, the inventors of the present invention define a figure of merit FOM as represented by the following equation:

$$FOM = 1/N \times S \times P \quad (1),$$

where "N" denotes a noise density, "P" denotes a power loss, and "S" denotes a chip area. The FOM of the chopper amplifier circuit according to the present preferred embodiment is 2.4 times as large as the FOM of each of the chopper amplifier circuits according to the fourth and eighth non-patent documents (See the fourth and eighth non-patent documents, for example).

As described above, the low noise chopper amplifier circuit is proposed that operates at the power source voltage of 1 V based on the auto-zero operation and the chopper stabilization technique. The main technique for the noise reduction at the low power source voltage is the implementation of the multiple-output switched operational amplifier and the chopper modulator using the virtual ground. The chopper amplifier circuit manufactured by the 0.18-micrometer CMOS process having the ordinary threshold value Vth attained a power spectral density (PSD) of a noise of 50 nV/√Hz, a total harmonic distortion THD of 50 dB, and a dynamic range of 88 dB at a power source voltage of 1 V.

INDUSTRIAL APPLICABILITY

As described above, according to the chopper amplifier circuit apparatus according to the present invention, an output signal from the chopper demodulator device is chopper-modulated by the second chopper modulator device, and then, is fed back to the input terminal of the amplifying device. Therefore, it is possible to provide a chopper amplifier circuit apparatus having a simpler circuit configuration, having a higher reliability, and being operable at a lower voltage as compared with that of the prior art. In addition, the chopper amplifier circuit apparatus is provided with a circuit for the auto-zero operation, and therefore, a DC offset can be appropriately performed on the input signal, and the low frequency noise can be reduced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A chopper amplifier circuit apparatus comprising:
    a first chopper modulator device for chopper-modulating an input signal according to a predetermined control signal, and outputting a chopper-modulated signal;
    an amplifying device having an input terminal, said amplifying device inputting the chopper-modulated signal outputted from said first chopper modulator device via said input terminal, amplifying the chopper-modulated signal, and outputting an amplified chopper-modulated signal;
    a chopper demodulator device having an output terminal, said chopper demodulator device chopper-demodulating the amplified chopper-modulated signal outputted from said amplifying device according to the control signal, and outputting a demodulated output signal from said output terminal as an output signal chopper-amplified by said chopper amplifier circuit; and
    a second chopper modulator device having an input terminal, said second chopper modulator device inputting a demodulated signal outputted from said chopper demodulator device via said input terminal, chopper-modulating the demodulated signal according to the control signal, and outputting a chopper-modulated signal to said input terminal of the amplifying device.

2. The chopper amplifier circuit apparatus as claimed in claim 1, further comprising:
    a switch device for executing an auto-zero operation by inputting a signal outputted from said amplifying device to said input terminal of said amplifying device during an auto-zero operation interval prior to a chopper amplification interval; and
    a capacitor device inserted between said output terminal of said chopper demodulator device and said input terminal of said second chopper modulator device, said capacitor device accumulating and holding an offset voltage at said output terminal of said chopper demodulator device during the auto-zero operation interval, and then cancelling an offset voltage at said input terminal of said amplifying device by an accumulated and held offset voltage.

3. The chopper amplifier circuit apparatus as claimed in claim 1, further comprising:
    a low-pass filter device for passing therethrough an amplified input signal by low-pass-filtering the output signal outputted from said chopper demodulator device so as to pass therethrough a frequency band of the input signal.

4. The chopper amplifier circuit apparatus as claimed in claim 2, further comprising:
    a low-pass filter device for passing therethrough an amplified input signal by low-pass-filtering the output signal outputted from said chopper demodulator device so as to pass therethrough a frequency band of the input signal.

5. The chopper amplifier circuit apparatus as claimed in claim 1,
    wherein said chopper amplifier circuit apparatus is constituted as a fully-differential amplifier circuit apparatus, and
    wherein said chopper amplifier circuit apparatus further comprises a common mode feedback circuit for generating a feedback signal fed back to said input terminal of said amplifying device so that a level of the output signal outputted from said chopper demodulator device becomes a predetermined reference value in a common mode, based on a fully-differential output signal outputted from said chopper demodulator device.

6. The chopper amplifier circuit apparatus as claimed in claim 2,
    wherein said chopper amplifier circuit apparatus is constituted as a fully-differential amplifier circuit apparatus, and
    wherein said chopper amplifier circuit apparatus further comprises a common mode feedback circuit for generating a feedback signal fed back to said input terminal of said amplifying device so that a level of the output signal outputted from said chopper demodulator device becomes a predetermined reference value in a common mode, based on a fully-differential output signal outputted from said chopper demodulator device.

7. The chopper amplifier circuit apparatus as claimed in claim 3,
    wherein said chopper amplifier circuit apparatus is constituted as a fully-differential amplifier circuit apparatus, and wherein said chopper amplifier circuit apparatus further comprises a common mode feedback circuit for generating a feedback signal fed back to said input terminal of said amplifying device so that a level of the output signal outputted from said chopper demodulator device becomes a predetermined reference value in a common mode, based on a fully-differential output signal outputted from said chopper demodulator device.

8. The chopper amplifier circuit apparatus as claimed in claim 1,
wherein said chopper amplifier circuit is formed by a CMOS circuit.

9. The chopper amplifier circuit apparatus as claimed in claim 2,
wherein said chopper amplifier circuit is formed by a CMOS circuit.

10. The chopper amplifier circuit apparatus as claimed in claim 3,
wherein said chopper amplifier circuit is formed by a CMOS circuit.

11. The chopper amplifier circuit apparatus as claimed in claim 4,
wherein said chopper amplifier circuit is formed by a CMOS circuit.

12. The chopper amplifier circuit apparatus as claimed in claim 8, further comprising a replica circuit having a bias voltage generator circuit formed in a manner similar to that of said amplifying device, said replica circuit generating a bias voltage of said amplifying device and supplying the bias voltage to said amplifying device.

13. The chopper amplifier circuit apparatus as claimed in claim 9, further comprising a replica circuit having a bias voltage generator circuit formed in a manner similar to that of said amplifying device, said replica circuit generating a bias voltage of said amplifying device and supplying the bias voltage to said amplifying device.

14. The chopper amplifier circuit apparatus as claimed in claim 10, further comprising a replica circuit having a bias voltage generator circuit formed in a manner similar to that of said amplifying device, said replica circuit generating a bias voltage of said amplifying device and supplying the bias voltage to said amplifying device.

15. The chopper amplifier circuit apparatus as claimed in claim 11, further comprising a replica circuit having a bias voltage generator circuit formed in a manner similar to that of said amplifying device, said replica circuit generating a bias voltage of said amplifying device and supplying the bias voltage to said amplifying device.

16. The chopper amplifier circuit apparatus as claimed in claim 8,
wherein said chopper demodulator device is formed by a CMOS output buffer circuit.

17. The chopper amplifier circuit apparatus as claimed in claim 9,
wherein said chopper demodulator device is formed by a CMOS output buffer circuit.

18. The chopper amplifier circuit apparatus as claimed in claim 10,
wherein said chopper demodulator device is formed by a CMOS output buffer circuit.

19. The chopper amplifier circuit apparatus as claimed in claim 11,
wherein said chopper demodulator device is formed by a CMOS output buffer circuit.

20. The chopper amplifier circuit apparatus as claimed in claim 12,
wherein said chopper demodulator device is formed by a CMOS output buffer circuit.

21. The chopper amplifier circuit apparatus as claimed in claim 13,
wherein said chopper demodulator device is formed by a CMOS output buffer circuit.

22. The chopper amplifier circuit apparatus as claimed in claim 14,
wherein said chopper demodulator device is formed by a CMOS output buffer circuit.

23. The chopper amplifier circuit apparatus as claimed in claim 15,
wherein said chopper demodulator device is formed by a CMOS output buffer circuit.

* * * * *